United States Patent
Kaneyasu

(10) Patent No.: US 9,806,098 B2
(45) Date of Patent: Oct. 31, 2017

(54) LIGHT-EMITTING DEVICE

(71) Applicant: Semiconductor Energy Laboratory Co., Ltd., Kanagawa-ken (JP)

(72) Inventor: Makoto Kaneyasu, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 124 days.

(21) Appl. No.: 14/562,098

(22) Filed: Dec. 5, 2014

(65) Prior Publication Data

US 2015/0162359 A1 Jun. 11, 2015

(30) Foreign Application Priority Data

Dec. 10, 2013 (JP) .................................. 2013-255172

(51) Int. Cl.
 *H01L 27/12* (2006.01)
 *H01L 29/786* (2006.01)
 *G09G 3/3233* (2016.01)

(52) U.S. Cl.
 CPC ....... *H01L 27/1225* (2013.01); *G09G 3/3233* (2013.01); *H01L 29/7869* (2013.01); *H01L 29/78696* (2013.01); *G09G 2300/0819* (2013.01); *G09G 2300/0842* (2013.01); *G09G 2310/0262* (2013.01); *G09G 2320/045* (2013.01)

(58) Field of Classification Search
 None
 See application file for complete search history.

(56) References Cited

U.S. PATENT DOCUMENTS

| | | | |
|---|---|---|---|
| 4,888,523 | A | 12/1989 | Shoji et al. |
| 5,155,613 | A | 10/1992 | Sakayori |
| 5,303,072 | A | 4/1994 | Takeda et al. |
| 5,652,600 | A | 7/1997 | Khormaei et al. |
| 5,744,864 | A | 4/1998 | Cillessen et al. |
| 5,767,832 | A | 6/1998 | Koyama et al. |
| 5,940,053 | A | 8/1999 | Ikeda |
| 5,990,629 | A | 11/1999 | Yamada et al. |
| 6,225,750 | B1 | 5/2001 | Kimura |
| 6,229,506 | B1 | 5/2001 | Dawson et al. |
| 6,246,180 | B1 | 6/2001 | Nishigaki |
| 6,362,798 | B1 | 3/2002 | Kimura et al. |
| 6,373,454 | B1 | 4/2002 | Knapp et al. |

(Continued)

FOREIGN PATENT DOCUMENTS

| | | |
|---|---|---|
| JP | 2001-42822 | 2/2001 |
| JP | 2005-157157 | 6/2005 |

(Continued)

*Primary Examiner* — Amare Mengistu
*Assistant Examiner* — Sarvesh J Nadkarni
(74) *Attorney, Agent, or Firm* — Husch Blackwell LLP

(57) ABSTRACT

To provide a light-emitting device capable of suppressing the display of an afterimage. A plurality of pixels arranged in n rows and m columns (n and m are each an integer of 2 or more) is supplied with a first signal containing image data and a second signal for initializing the pixels. Each pixel includes a first transistor for controlling the input of the first signal and a second transistor for controlling the input of the second signal. The first transistor in a k-th row (k is an integer of 1 to n) and the second transistor in a k+1-th row are turned on at the same time, so that the pixels are initialized and display images effectively.

11 Claims, 16 Drawing Sheets

(56) References Cited

U.S. PATENT DOCUMENTS

| | | |
|---|---|---|
| 6,373,455 B1 | 4/2002 | Kuribayashi et al. |
| 6,417,825 B1 | 7/2002 | Stewart et al. |
| 6,456,267 B1 | 9/2002 | Sato et al. |
| 6,525,704 B1 | 2/2003 | Kondo et al. |
| 6,528,950 B2 | 3/2003 | Kimura |
| 6,542,138 B1 | 4/2003 | Shannon et al. |
| 6,548,960 B2 | 4/2003 | Inukai |
| 6,583,775 B1 | 6/2003 | Sekiya et al. |
| 6,621,489 B2 | 9/2003 | Yangisawa et al. |
| 6,791,129 B2 | 9/2004 | Inukai |
| 6,903,731 B2 | 6/2005 | Inukai |
| 7,061,014 B2 | 6/2006 | Hosono et al. |
| 7,106,290 B2 | 9/2006 | Inukai et al. |
| 7,250,720 B2 | 7/2007 | Sakakura et al. |
| 7,286,108 B2 | 10/2007 | Tsuda et al. |
| 7,321,353 B2 | 1/2008 | Tsuda et al. |
| 7,601,984 B2 | 10/2009 | Sano et al. |
| 7,671,826 B2 | 3/2010 | Kimura |
| 7,674,650 B2 | 3/2010 | Akimoto et al. |
| 7,791,072 B2 | 9/2010 | Kumomi et al. |
| 7,791,074 B2 | 9/2010 | Iwasaki |
| 7,817,117 B2 | 10/2010 | Kimura |
| 7,859,525 B2 | 12/2010 | Takatori et al. |
| 7,924,276 B2 | 4/2011 | Tsuda et al. |
| 8,139,002 B2 | 3/2012 | Kim et al. |
| 8,158,979 B2 | 4/2012 | Kang et al. |
| 8,289,244 B2 | 10/2012 | Hasumi et al. |
| 8,325,310 B2 | 12/2012 | Ishitani |
| 8,470,649 B2 | 6/2013 | Yamazaki et al. |
| 2002/0047555 A1* | 4/2002 | Inukai ............... G09G 3/3233 315/169.3 |
| 2005/0030265 A1 | 2/2005 | Miyagawa |
| 2006/0022932 A1 | 2/2006 | Sagawa et al. |
| 2006/0208976 A1 | 9/2006 | Ikeda |
| 2008/0100595 A1 | 5/2008 | Wu et al. |
| 2009/0001881 A1 | 1/2009 | Nakayama |
| 2011/0148826 A1 | 6/2011 | Koyama et al. |
| 2011/0148846 A1 | 6/2011 | Arasawa et al. |
| 2011/0175883 A1 | 7/2011 | Toyotaka et al. |
| 2011/0175894 A1 | 7/2011 | Wakimoto et al. |
| 2013/0241431 A1 | 9/2013 | Toyotaka et al. |

FOREIGN PATENT DOCUMENTS

| | | |
|---|---|---|
| JP | 2007-96055 | 4/2007 |
| JP | 2009-31750 | 2/2009 |
| JP | 2011-100092 | 5/2011 |

\* cited by examiner

FIG. 15A
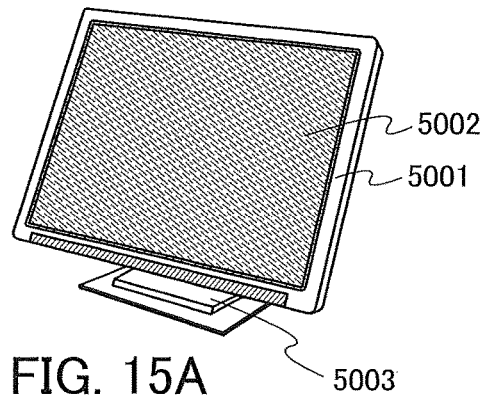
FIG. 15B
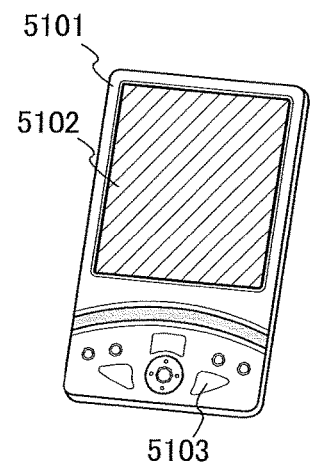
FIG. 15C
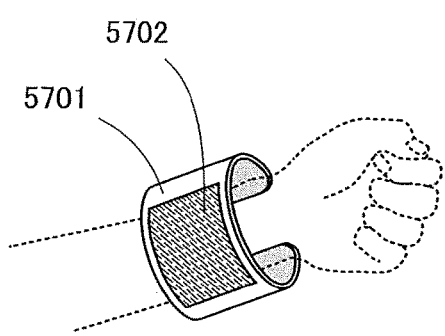
FIG. 15D
FIG. 15E
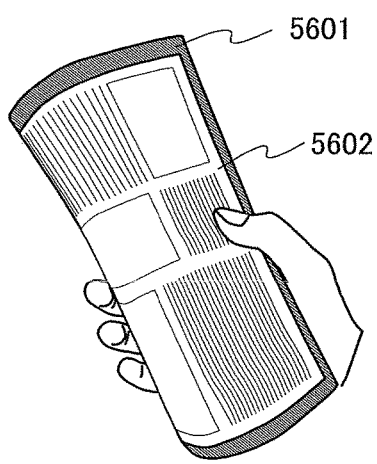
FIG. 15F
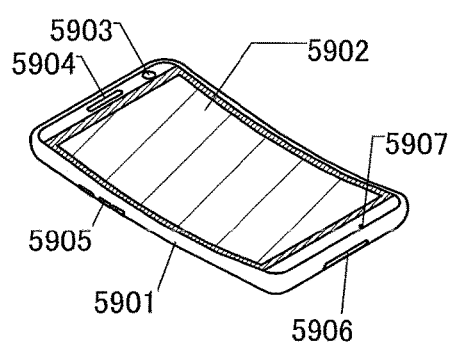

LIGHT-EMITTING DEVICE

BACKGROUND OF THE INVENTION

1. Field of the Invention

The present invention relates to an object, a method, or a manufacturing method. The present invention relates to a process, a machine, manufacture, or a composition of matter. One embodiment of the present invention relates to a semiconductor device, a display device, a light-emitting device, a power storage device, a memory device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

Since light-emitting devices using light-emitting elements have high visibility, are suitable for reduction in thickness, and do not have limitations on viewing angle, they have attracted attention as display devices which are alternatives to CRTs (cathode ray tube) or liquid crystal display devices. Specifically proposed structures of active matrix display devices using light-emitting elements are different depending on manufacturers. In general, a pixel includes at least a light-emitting element, a transistor that controls input of image signals to the pixel (a switching transistor), and a transistor that controls the amount of current supplied to the light-emitting element (a driving transistor).

In recent years, oxide semiconductors have attracted attention as a novel semiconductor having high mobility as in the case of polysilicon or microcrystalline silicon and having uniform element characteristics as in the case of amorphous silicon. Oxide semiconductors can be deposited on a substrate which has a low strain point, such as a glass substrate, and can be used for a large substrate of the fifth generation (one side of which exceeds 1000 mm) or later generation. A light-emitting device in which the oxide semiconductor is used for a transistor in a pixel instead of a conventional semiconductor such as silicon or germanium is being put to practical use.

Patent Document 1 describes a TFT in which an oxide semiconductor is used as an active layer is used for driving an organic EL element. Patent Document 2 describes an organic electroluminescent display device in which an active layer of a thin film transistor is formed using an oxide semiconductor.

REFERENCE

Patent Document

[Patent Document 1] Japanese Published Patent Application No. 2009-031750
[Patent Document 2] Japanese Published Patent Application No. 2011-100092

SUMMARY OF THE INVENTION

A transistor including the oxide semiconductor has a characteristic of significantly small off-state current. With the use of the transistor having the characteristic included in a pixel in a light-emitting device, the pixel can hold image data input once. In so far as a still image is displayed, writing frequency of image data can be reduced and power-saving is achieved in the display device. However, in the above-described light-emitting device, when different image data is input to a pixel after image data is held for a long time, the original image data cannot be rewritten completely and remains in the pixel as an afterimage in some cases.

In view of the foregoing technical background, an object of one embodiment of the present invention is to provide a novel semiconductor device or the like, a light-emitting device capable of suppressing afterimages, or a driving method of the light-emitting device capable of suppressing afterimages.

An object of one embodiment of the present invention is to provide a light-emitting device capable of displaying image data even with a high scan frequency or a driving method of the light-emitting device capable of displaying image data even with a high scan frequency.

Note that a plurality of objects does not mutually preclude their existence. One embodiment of the present invention does not necessarily achieve all the objects listed above. Objects other than those listed above are apparent from the description of the specification, drawings, and claims, and such objects could be an object of one embodiment of the present invention.

One embodiment of the present invention is a light-emitting device including a first transistor, a second transistor, a third transistor, a fourth transistor, a fifth transistor, a sixth transistor, a first light-emitting element, a second light-emitting element, a first wiring, a second wiring, a third wiring, a fourth wiring, and a fifth wiring. A gate of the first transistor is connected to the second wiring. One of a source and a drain of the first transistor is connected to the fourth wiring and the other of the source and the drain of the first transistor is connected to a gate of the third transistor. A gate of the second transistor is connected to the first wiring. One of a source and a drain of the second transistor is connected to the fifth wiring and the other of the source and the drain of the second transistor is connected to the gate of the third transistor. One of a source and a drain of the third transistor is connected to a first terminal of the first light-emitting element. The other of the source and the drain of the third transistor is supplied with a first potential. A second terminal of the first light-emitting element is supplied with a second potential. A gate of the fourth transistor is connected to the third wiring. One of a source and a drain of the fourth transistor is connected to the fourth wiring and the other of the source and the drain of the fourth transistor is connected to a gate of the sixth transistor. A gate of the fifth transistor is connected to the second wiring. One of a source and a drain of the fifth transistor is connected to the fifth wiring and the other of the source and the drain of the fifth transistor is connected to the gate of the sixth transistor. One of a source and a drain of the sixth transistor is connected to a first terminal of the second light-emitting element. The other of the source and the drain of the sixth transistor is supplied with the first potential. A second terminal of the second light-emitting element is supplied with the second potential. The fourth wiring is supplied with a signal containing image data. The fifth wiring is supplied with a third potential.

One embodiment of the present invention is a light-emitting device including a first transistor, a second transistor, a third transistor, a fourth transistor, a fifth transistor, a sixth transistor, a first light-emitting element, a second light-emitting element, a first wiring, a second wiring, a third wiring, a fourth wiring, and a fifth wiring. A gate of the first transistor is connected to the second wiring. One of a source and a drain of the first transistor is connected to the fourth wiring and the other of the source and the drain of the first transistor is connected to a gate of the third transistor. A gate of the second transistor is connected to the first wiring. One of a source and a drain of the second transistor is connected to the fifth wiring and the other of the source and the drain of the second transistor is connected to the gate of the third transistor. One of a source and a drain of the third transistor is connected to a first terminal of the first light-emitting element. The other of the source and the drain of the third transistor is supplied with a first potential. A second terminal of the first light-emitting element is supplied with a second potential. A gate of the fourth transistor is connected to the third wiring. One of a source and a drain of the fourth transistor is connected to the fourth wiring and the other of the source and the drain of the fourth transistor is connected to a gate of the sixth transistor. A gate of the fifth transistor is connected to the second wiring. One of a source and a drain of the fifth transistor is connected to the fifth wiring and the other of the source and the drain of the fifth transistor is connected to the gate of the sixth transistor. One of a source and a drain of the sixth transistor is connected to a first terminal of the second light-emitting element. The other of the source and the drain of the sixth transistor is supplied with the first potential. A second terminal of the second light-emitting element is supplied with the second potential. The fourth wiring is supplied with a signal containing image data. The fifth wiring is supplied with the second potential.

One embodiment of the present invention is a light-emitting device including a first transistor, a second transistor, a third transistor, a fourth transistor, a fifth transistor, a sixth transistor, a first capacitor, a second capacitor, a first light-emitting element, a second light-emitting element, a first wiring, a second wiring, a third wiring, and a fourth wiring. A gate of the first transistor is connected to the second wiring. One of a source and a drain of the first transistor is connected to the fourth wiring and the other of the source and the drain of the first transistor is connected to a gate of the third transistor. A gate of the second transistor is connected to the first wiring. One of a source and a drain of the second transistor is connected to one of a source and a drain of the third transistor and the other of the source and the drain of the second transistor is connected to the gate of the third transistor. The one of the source and the drain of the third transistor is connected to a first terminal of the first light-emitting element. The other of the source and the drain of the third transistor is supplied with a first potential. A first terminal and a second terminal of the first capacitor are connected to the gate and the one of the source and the drain of the third transistor, respectively. A second terminal of the first light-emitting element is supplied with a second potential. A gate of the fourth transistor is connected to the third wiring. One of a source and a drain of the fourth transistor is connected to the fourth wiring and the other of the source and the drain of the fourth transistor is connected to a gate of the sixth transistor. A gate of the fifth transistor is connected to the second wiring. One of a source and a drain of the fifth transistor is connected to one of a source and a drain of the sixth transistor and the other of the source and the drain of the fifth transistor is connected to the gate of the sixth transistor. One of a source and a drain of the sixth transistor is connected to a first terminal of the second light-emitting element. The other of the source and the drain of the sixth transistor is supplied with the first potential. A first terminal and a second terminal of the second capacitor are connected to the gate and the one of the source and the drain of the sixth transistor. A second terminal of the second light-emitting element is supplied with the second potential. The fourth wiring is supplied with a signal containing image data.

One embodiment of the present invention is a light-emitting device including a first transistor, a second transistor, a third transistor, a fourth transistor, a fifth transistor, a sixth transistor, a first light-emitting element, a second light-emitting element, a first wiring, a second wiring, a third wiring, a fourth wiring, and a fifth wiring. A gate of the first transistor is connected to the second wiring. One of a source and a drain of the first transistor is connected to the fourth wiring and the other of the source and the drain of the first transistor is connected to a gate of the third transistor. A gate of the second transistor is connected to the first wiring. One of a source and a drain of the second transistor is connected to the fifth wiring and the other of the source and the drain of the second transistor is connected to the gate of the third transistor. One of a source and a drain of the third transistor is connected to a first terminal of the first light-emitting element. The other of the source and the drain of the third transistor is supplied with a first potential. A second terminal of the first light-emitting element is supplied with a second potential. A gate of the fourth transistor is connected to the third wiring. One of a source and a drain of the fourth transistor is connected to the fourth wiring and the other of the source and the drain of the fourth transistor is connected to a gate of the sixth transistor. A gate of the fifth transistor is connected to the second wiring. One of a source and a drain of the fifth transistor is connected to the fifth wiring and the other of the source and the drain of the fifth transistor is connected to the gate of the sixth transistor. One of a source and a drain of the sixth transistor is connected to a first terminal of the second light-emitting element. The other of the source and the drain of the sixth transistor is supplied with the first potential. A second terminal of the second light-emitting element is supplied with the second potential. The fourth wiring is supplied with a signal containing image data. The fifth wiring is supplied with the first signal only one period that the first wiring is selected earlier than the signal is supplied to the fourth wiring.

In the above embodiment, each of the first to the sixth transistors preferably contains an oxide semiconductor in a channel formation region.

In the above embodiment, the oxide semiconductor preferably contains indium, zinc, and M (M is Ga, Sn, Hf, Al, or Zr).

Another embodiment of the present invention is an electronic device including the above-described light-emitting device, a microphone, and an operation key.

Note that the term "connection" in this specification refers to electrical connection and corresponds to a state of a circuit configuration in which current, voltage, or a potential can be supplied or transmitted. Therefore, a state of electrical connection means not only a state of direct connection but also a state of indirect connection through a circuit element such as a resistor, a diode, a transistor, an inductor, or a capacitor in which current, voltage, or a potential can be supplied or transmitted.

In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

The "source terminal" of the transistor means a source region which is part of an active layer or a source electrode which is connected to an active layer. Similarly, the "drain terminal" of the transistor means a drain region which is part of an active layer or a drain electrode which is connected to an active layer.

The terms "source terminal" and "drain terminal" of a transistor interchange with each other depending on the type of the channel of the transistor or levels of potentials applied to the source terminal and the drain terminal. In general, as for a source terminal and a drain terminal in an n-channel transistor, one to which a lower potential is supplied is called a source terminal, and one to which a higher potential is supplied is called a drain terminal. As for a source terminal and a drain terminal in a p-channel transistor, one to which a lower potential is supplied is called a drain terminal, and one to which a higher potential is supplied is called a source terminal. In this specification, although the connection relation of the transistor is described assuming that the source terminal and the drain terminal are fixed in some cases for convenience, actually, the names of the source terminal and the drain terminal interchange with each other depending on the relation of the potentials.

According to one embodiment of the present invention, a novel semiconductor device or the like, a light-emitting device capable of suppressing afterimages, or a driving method of the light-emitting device capable of suppressing afterimages can be provided.

According to one embodiment of the present invention, a light-emitting device capable of displaying image data even with a high scan frequency or a driving method of the light-emitting device capable of displaying image data even with a high scan frequency can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 15A to 15F illustrate electronic devices.

DETAILED DESCRIPTION OF THE INVENTION

Figure 1A:
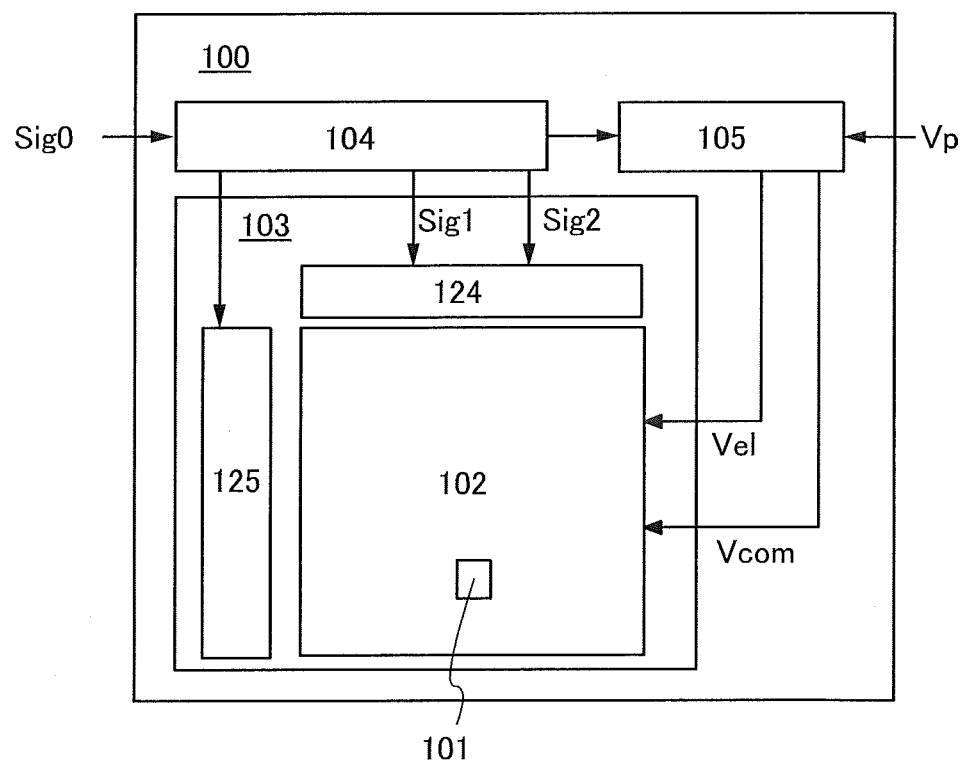
FIGS. 1A and 1B illustrate the structures of a light-emitting device and a pixel.

Embodiments of the present invention will be described below in detail with reference to the drawings. Note that the present invention is not limited to the description below, and it is easily understood by those skilled in the art that modes and details can be modified in various ways without departing from the scope and spirit of the present invention. Therefore, the present invention should not be interpreted as being limited to the description of the embodiments given below.

In the following embodiments, the same portions or portions having similar functions are denoted by the same reference numerals in different drawings, and description thereof will not be repeated.

When the same reference numerals need to be distinguished from each other, "(n)", "(m, n)", or the like may be added to the reference numerals.

Embodiment 1

A configuration example of a light-emitting device according to one embodiment of the present invention is shown in a block diagram of FIG. 1A. Although the block diagram shows elements classified according to their functions in independent blocks, it may be practically difficult to completely separate the elements according to their functions and, in some cases, one element may be involved in a plurality of functions.

A light-emitting device 100 in FIG. 1A includes at least a panel 103 including a pixel portion 102 composed of a plurality of pixels 101, a signal line driver circuit (a source driver) 124, and a scan line driver circuit (a gate driver) 125; a controller 104, and a power supply circuit 105. Each of the pixels 101 includes a light-emitting element and a transistor for controlling operation of the light-emitting element.

When a signal Sig0 containing image data is input to the controller 104, the controller 104 has a function of processing the signal Sig0 in accordance with the specification of the panel 103 and then supplying it as a signal Sig1 to the panel 103. In addition, the controller 104 has a function of generating a signal Sig2 containing no image data and supplies the signal to the panel 103.

The power supply circuit 105 has a function of generating a voltage from a voltage Vp input to the light-emitting device 100; the voltage is supplied to the panel 103, the controller 104, and other various circuits in the light-emitting device 100. In addition, the power supply circuit 105 has a function of supplying a voltage VDD to each of the plurality of pixels 101 included in the pixel portion 102. Specifically, in FIG. 1A, the voltage VDD is supplied as the potential difference between a fixed potential Vcom (e.g., ground potential) and a potential Vel to each of the plurality of pixels 101. The controller 104 has a function of determining whether the power supply circuit 105 supplies the voltage VDD to the plurality of pixels 101.

Note that the power supply circuit 105 may have a function of controlling supply of the voltage to various circuits included in the panel 103.

The scan line driver circuit 125 has a function of selecting the plurality of pixels 101 included in the pixel portion 102 per row.

The signal line driver circuit 124 has a function of supplying the signal Sig1 or the signal Sig2 applied from the controller 104 to the pixels 101 in a row selected by the scan line driver circuit 125.

The signal Sig2 here is a constant potential not containing image data, which can be generated in either the signal line driver circuit 124 or the power supply circuit 105. The potential Vcom or the potential Vel may be applied as the signal Sig2.

Figure 1B:
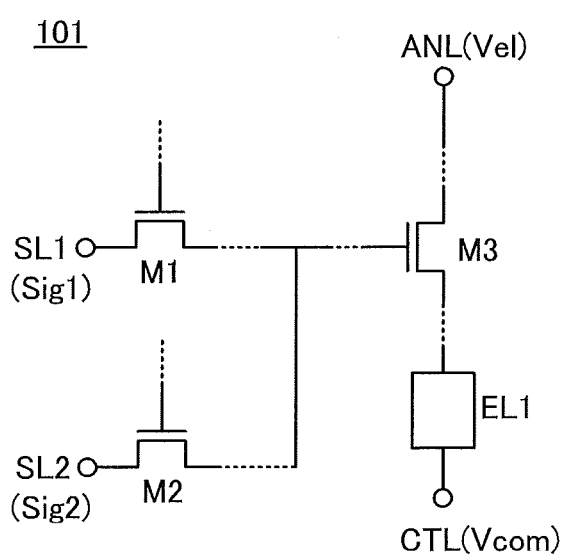

Next, FIG. 1B shows a specific configuration example of the pixel 101. The pixel 101 in FIG. 1B includes at least a light-emitting element EL1, a transistor M1, a transistor M2, and a transistor M3.

The light-emitting element EL1 includes in its category an element whose luminance is controlled by current or voltage. For example, an organic light-emitting diode (OLED) is used as the light-emitting element EL1. An OLED includes at least an EL layer, an anode, and a cathode. The EL layer is a single layer or multilayer provided between the anode and the cathode, at least one of which is a light-emitting layer containing a light-emitting substance. From the EL layer, electroluminescence is obtained by current supplied when a potential difference between the cathode and the anode, using the potential of the cathode as a reference potential, is higher than or equal to a threshold voltage Vthe of the light-emitting element EL1. As electroluminescence, there are luminescence (fluorescence) at the time of returning from a singlet-excited state to a ground state and luminescence (phosphorescence) at the time of returning from a triplet-excited state to a ground state.

The transistor M3 has a function of controlling supply of a power voltage corresponding to the potential difference between the potential Vcom and the potential Vel, to the light-emitting element EL1. That is, the power voltage is supplied to the light-emitting element EL1 through the transistor M3.

The transistor M1 has a function of controlling input of the signal Sig1 which is applied to the panel 103 by the controller 104, to a gate electrode of the transistor M3.

The transistor M2 has a function of controlling input of the signal Sig2 which is applied to the panel 103 by the controller 104, to a gate electrode of the transistor M3.

Specifically, in the pixel 101, one of a source terminal and a drain terminal of the transistor M3 is connected to a wiring ANL applied with the potential Vel, and the other thereof is connected to one of an anode and a cathode of the light-emitting element EL1. The other of the anode and the cathode of the light-emitting element EL1 is connected to a terminal CTL applied with the potential Vcom. In addition, one of a source terminal and a drain terminal of the transistor M1 is connected to a wiring SL1 applied with the potential of the signal Sig1, and the other thereof is connected to the gate electrode of the transistor M3. A gate electrode of the transistor M1 is applied with a signal for turning on/off the transistor M1. In addition, one of a source terminal and a drain terminal of the transistor M2 is connected to a wiring SL2 applied with the potential of the signal Sig2, and the other thereof is connected to the gate electrode of the transistor M3. A gate electrode of the transistor M2 is applied with a signal for turning on/off the transistor M2.

In one embodiment of the present invention, the signal Sig1 containing image data is applied to the wiring SL1 in a normal operation state for displaying an image in the pixel portion 102. The signal Sig2 containing no image data is applied to the wiring SL2.

An operation example of the pixel 101 shown in FIG. 1B is described with reference to FIGS. 2A to 2D. FIGS. 2A to 2D schematically show operation of the pixel 101. FIGS. 2A to 2D each show an example in which a capacitor C1 for holding the gate voltage of the transistor M3 is included in the pixel 101. Note that the capacitor C1 is not necessarily provided in the pixel 101 in the case where the gate capacitance formed between the gate electrode (G) and an active layer of the transistor M3 or the parasitic capacitance of the gate electrode is large enough. In FIGS. 2A to 2D, the transistor M1 and the transistor M2 are illustrated as a switch, and a drain terminal (D) and a source terminal (S) of the transistor M3 are connected to the wiring ANL and the light-emitting element EL1, respectively.

Figure 2A:
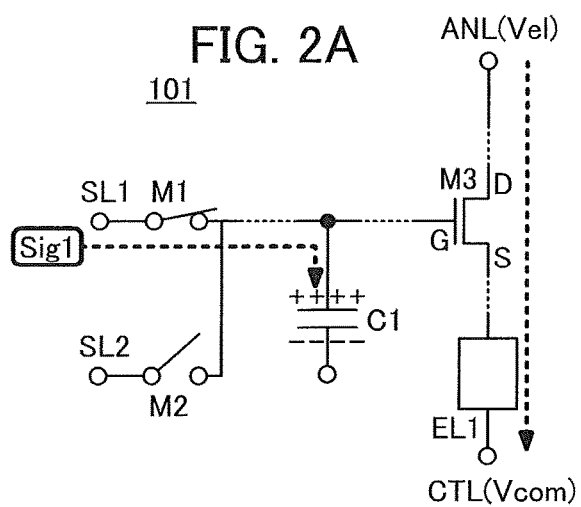
FIGS. 2A to 2D illustrate operation of a pixel.

FIG. 2A schematically shows operation of the pixel 101 in the case where the signal Sig1 containing image data is input to the pixel 101. In FIG. 2A, the potential of the signal Sig1 is applied to the gate electrode of the transistor M3 from the wiring SL1 through the transistor M1 being ON. Charges are accumulated in the capacitor C1 according to the potential. In the case where the power voltage is applied between the terminal CTL and the wiring ANL, a value of a drain current of the transistor M3 is determined according to the potential of the signal Sig1, and the luminance of the light-emitting element EL1 is determined according to the value of the drain current.

Figure 2B:
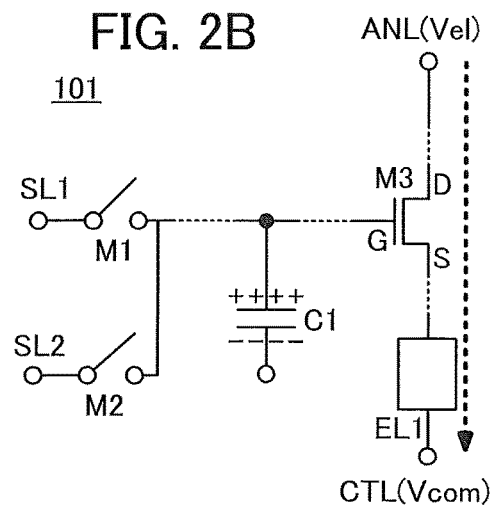

FIG. 2B schematically shows operation of the pixel 101 when the signal Sig1 is held in the pixel 101. In FIG. 2B, the transistor M1 is turned off, whereby the wiring SL1 is electrically separated from the gate electrode of the transistor M3. Accordingly, the accumulated charges are held in the capacitor C1 and the potential of the gate electrode of the transistor M3 is also held. When the power voltage is applied between the terminal CTL and the wiring ANL, the value of the drain current of the transistor M3 determined according to the potential of the signal Sig1 and the luminance of the light-emitting element EL1 are held even after the transistor M1 is turned off.

In the case where the off-state current of the transistor M1 is extremely small, the charges held in the capacitor C1 can be prevented from being leaked through the transistor M1. In this case, after the transistor M1 is turned off to complete the input of the signal Sig1 to the pixel 101, the potential of the gate electrode of the transistor M3 is hardly changed; thus, luminance of the light-emitting element EL1 can be prevented from being changed.

Figure 2C:
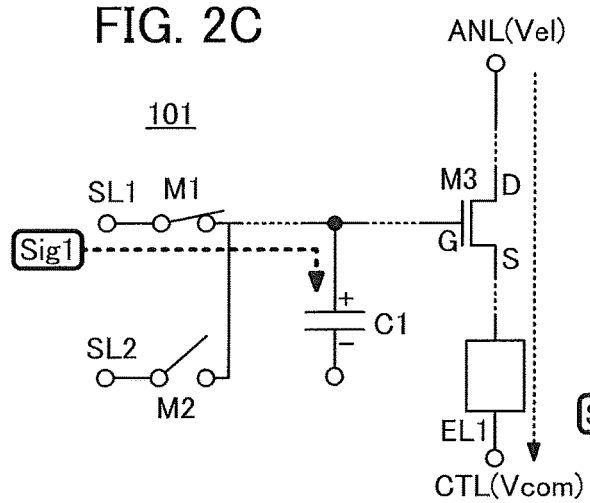

When the off-state current of the transistor M1 is extremely small, the charge accumulated in the capacitor C1 keeps being held and cannot be completely replaced even when a signal Sig1 containing image data different from that in FIG. 2A is input, so that the previous image data might be displayed on the pixel portion 102 as an afterimage. For example, FIG. 2C schematically shows operation when the signal Sig1 for turning off the transistor M3 and making the light-emitting element EL1 a non-emission state is applied to the pixel 101. Even when the signal Sig1 is input, charge held in the capacitor C1 is not completely erased. As a result, the transistor M3 remains ON, and current continues to be supplied to the light-emitting element EL1, so that an afterimage is displayed on the pixel portion 102.

To solve the problem, in one embodiment of the present invention, just before the signal Sig1 is supplied to the pixel 101, the signal Sig2 containing no image data is input to the pixel 101 to initialize the potential of the gate electrode of the transistor M3.

Figure 2D:
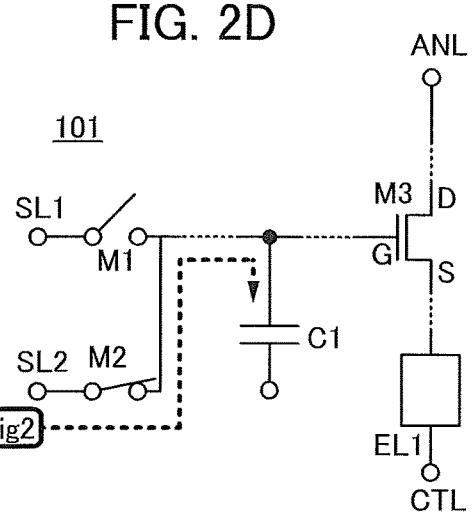

FIG. 2D schematically shows operation of the pixel 101 in the case where the signal Sig2 containing no image data is input to the pixel 101. In FIG. 2D, the potential of the signal Sig2 is applied to the gate electrode of the transistor M3 from the wiring SL2 through the transistor M2 being ON. In the case where the transistor M3 is n-channel type, the potential of the signal Sig2 has a level such that the gate voltage of the transistor M3 is equal to or lower than the threshold voltage. In the case where the transistor M3 is p-channel type, the potential of the signal Sig2 has a level such that the gate voltage of the transistor M3 is equal to or higher than the threshold voltage.

Accordingly, in the case where the charges are accumulated in the capacitor C1 according to the potential of the signal Sig1, the charges are released by input of the potential of the signal Sig2 to the pixel 101. As a result, the transistor M3 is tuned off, and the light-emitting element EL1 does not emit light.

After that, the signal Sig1 is input again to the pixel 101, and the luminance of the light-emitting element EL1 is determined according to the potential of the signal Sig1. At this time, an afterimage is not displayed on the pixel portion 102 because the pixel 101 is initialized by the signal Sig2 in advance.

Although FIG. 1B illustrates the example where the transistors M1 to M3 each have a single-gate structure, each of the transistors may have a multi-gate structure in which a plurality of electrically connected gate electrodes are included so that a plurality of channel formation regions are included.

Figure 3:
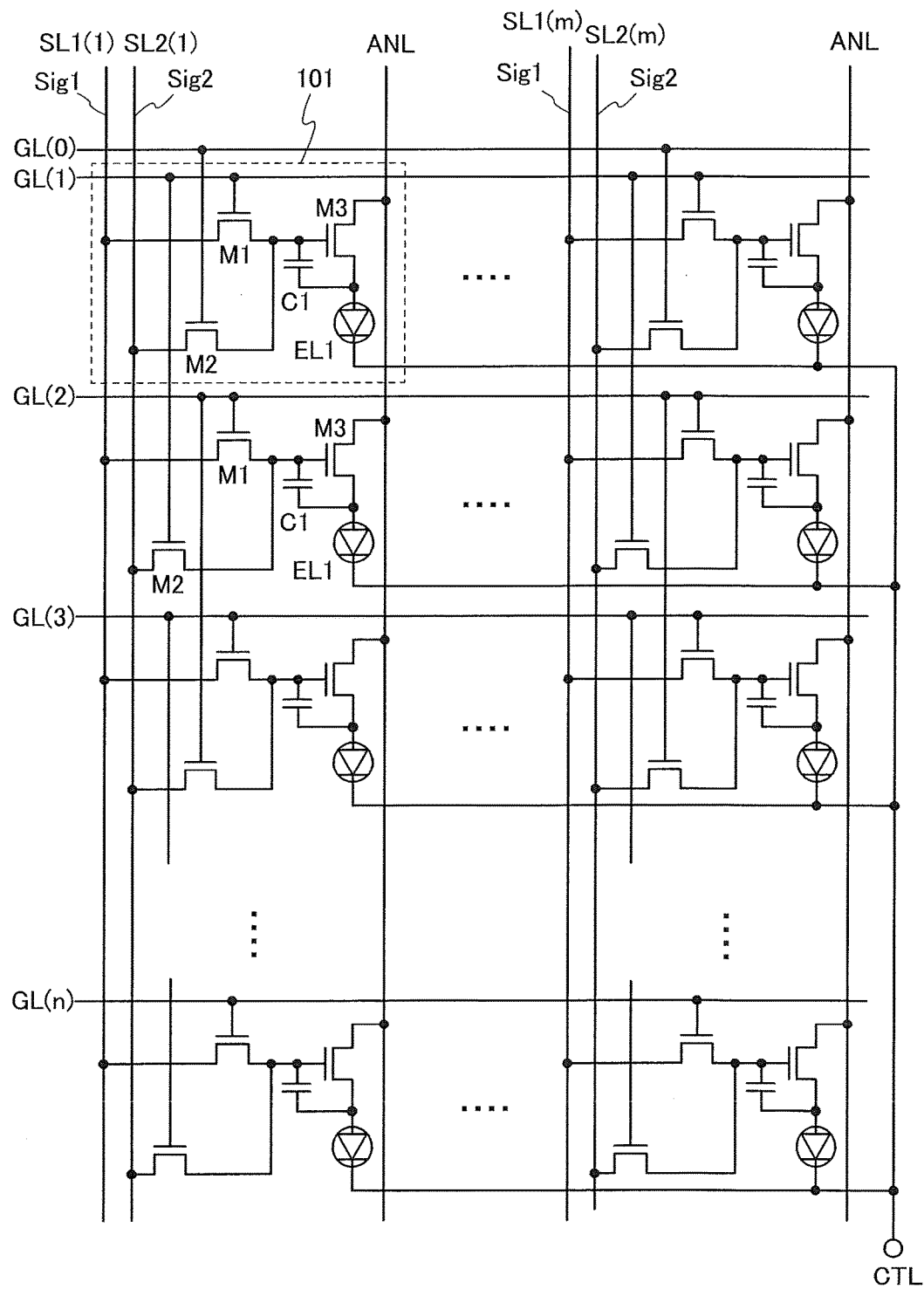
FIG. 3 is a circuit diagram of a pixel portion.

Next, a structure example of the pixel portion 102 is described. FIG. 3 is an example of a specific circuit diagram of the pixel portion 102.

As shown in FIG. 3, the pixel portion 102 includes a plurality of wirings GL, a plurality of wirings SL1, a plurality of wirings SL2, a wiring ANL, and a plurality of pixels 101. The pixels 101 included in the pixel portion 102 are arranged in a matrix of m rows and n columns (n and in are each an integer of 2 or larger), for example. Note that the pixels 101 in the pixel portion 102 are numbered as the first row, the second row, to the n-th row beginning at the top of FIG. 3, and as the first column, the second column, to the m-th column beginning at the left of FIG. 3. The wirings GL are put reference numerals from GL(0), GL(1), GL(2), to GL(n) beginning at the top. The wirings SL1 are numbered from SL1(1), SL1(2), to SL1(*m*) beginning at the left. The wirings SL2 are numbered from SL2(1), SL2(2), to SL2(*m*) beginning at the left. The plurality of pixels 101 is electrically connected to the terminal CTL.

In the case of the light-emitting device 100 shown in FIG. 1A, the plurality of wirings SL1 is connected to the signal line driver circuit 124, the plurality of wirings GL is connected the scan line driver circuit 125, and the wiring ANL and the terminal CTL are connected to the power supply circuit 105. Each pixel 101 is connected to one of the plurality of wirings SL1, two of the plurality of wirings GL, one of the plurality of wirings SL2, and the wiring ANL. All the pixels 101 are connected to the terminal CTL.

In the pixel 101 in the k-th row (k is an integer of 1 or larger), a gate electrode of a transistor M1 is connected to a wiring GL(k). That is, when the wiring GL(k) is selected, the transistor M1 is turned on, and then, the signal Sig1 is input to the pixel 101 in the k-th row from the wiring SL1 via the transistor M1.

In the pixel 101 in the (k+1)-th row, a gate electrode of a transistor M2 is connected to a wiring GL(k) in the previous row. In other words, the transistor M2 is turned on when the wiring GL(k) is selected, and the signal Sig2 is input to the pixel 101 in the (k+1)th row from the wiring SL2 via the transistor M2, so that the pixel 101 are initialized.

In the case where the signal Sig1 containing image data is input to the pixel 101, a light-emitting state of the light-emitting element EL1 is determined according to the potential of the signal Sig1. Specifically, when the transistor M3 is turned on in response to the potential of the signal Sig1, the light-emitting element EL1 is supplied with current and then is in the light-emitting state. When the transistor M3 is turned off in response to the potential of the signal Sig1 or the signal Sig2, the light-emitting element EL1 is not supplied with current and is in the non-light-emitting state.

Figure 4:
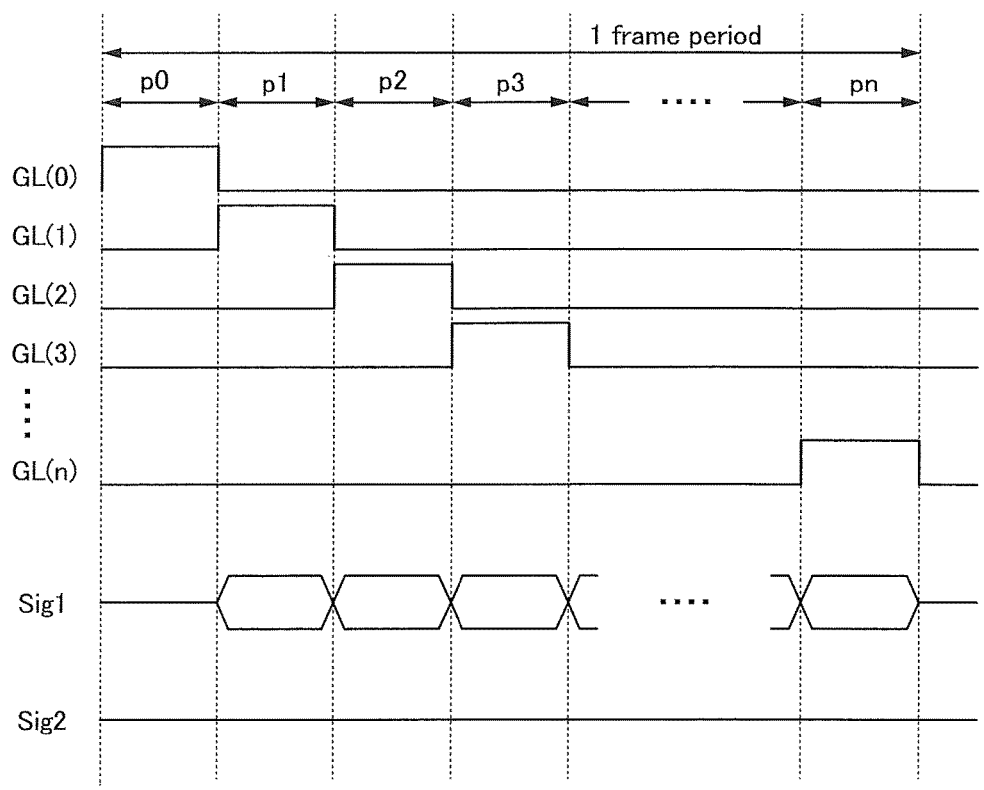
FIG. 4 is a timing chart of a pixel portion.

The operation of the pixel portion 102 will be described with reference to the timing chart of FIG. 4. FIG. 4 is an example of a timing chart of potentials supplied to the plurality of the wirings GL (GL(0) to GL(n)), the signal Sig1 supplied to the wiring SL1, and the signal Sig2 supplied to the wiring SL2, which are shown in FIG. 3. The timing chart of FIG. 4 corresponds to one frame period which is divided into (n+1) periods of a period p0 to a period pn. Note that the timing chart shown in FIG. 4 is an example in which all the transistors included in the pixel portion 102 illustrated in FIG. 3 are n-channel transistors.

The signal Sig2 is kept at a constant potential from the period p0 to the period pn.

First, in the period p0, the wiring GL(0) is selected, thereby inputting the signal Sig2 to the pixel 101 in the first row to initialize the pixel.

Next, in the period p1, the wiring GL(0) is deselected, i.e., a low-level potential is applied to the wiring GL(0), and the GL(1) is selected. The wiring GL(1) is thus selected, and the signal Sig1 is input to the pixel 101 in the first row. At the same time, the signal Sig2 is applied to the pixel 101 in the second row, so that the pixel is initialized.

In the period p2, the wiring GL(1) deselected, and the state in the period p1 is kept in the pixel 101 in the first row until the next signal is input. The wiring GL(2) is selected, thereby inputting the signal Sig1 to the pixel 101 in the second row. At the same time, the signal Sig2 is applied also to the pixel 101 in the third row, thereby initializing the pixel.

The above operation is repeated until the wiring GL(n) is selected, and the pixels 101 in the first row to the n-th row are sequentially initialized using the signal Sig2 and input with the signal Sig1, thereby displaying an image on the pixel portion 102.

As described above, the timing of inputting the signal Sig2 to a pixel in one row is synchronized with the timing of selecting the wiring GL in the previous row; thus, the signal Sig2 can be input to the pixel 101 with no delay even when the scan frequency of the light-emitting device 100 is set high.

Figure 5:
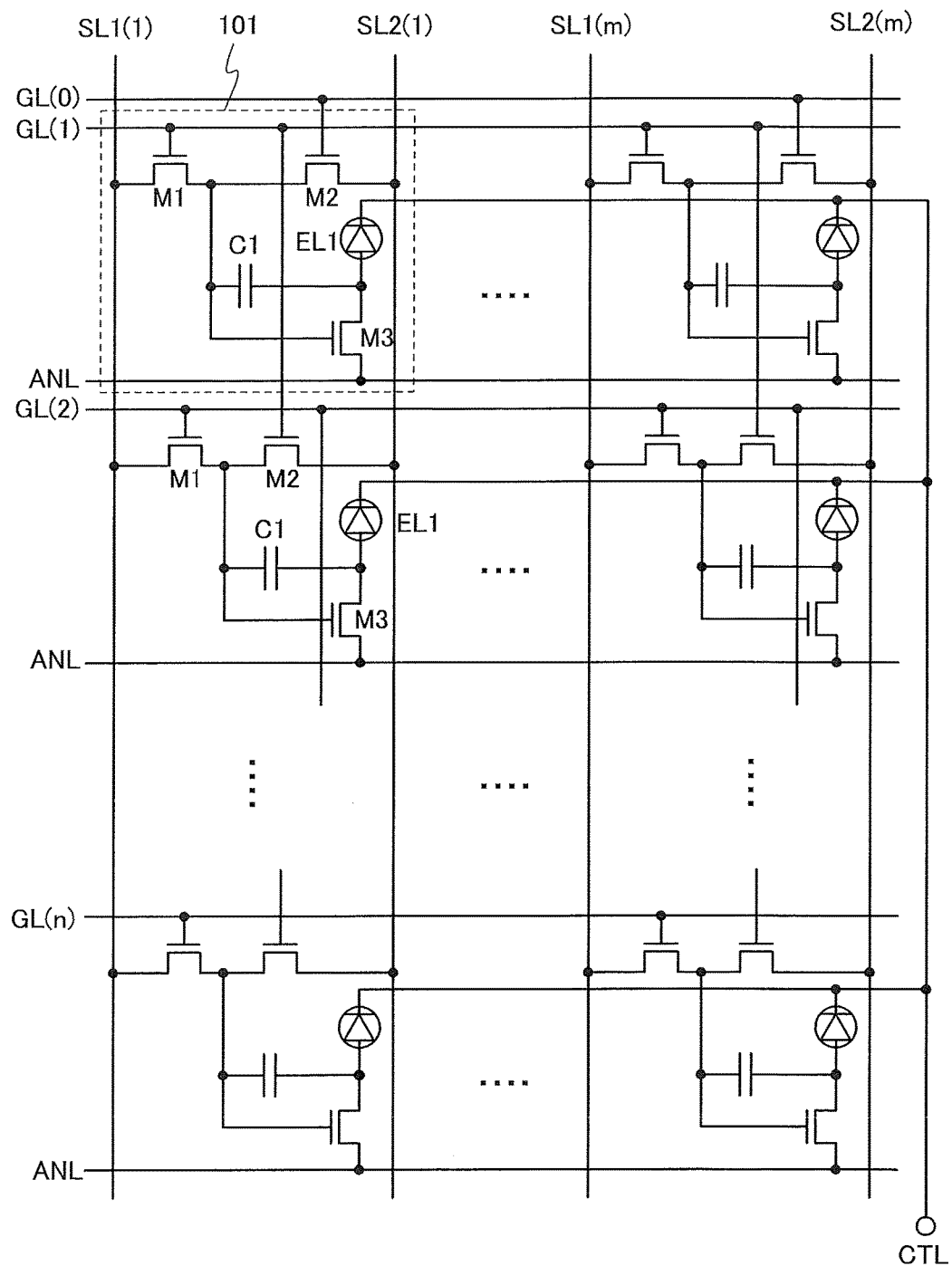
FIG. 5 is a circuit diagram of a pixel portion.

FIG. 5 is a modification of the circuit diagram of FIG. 3. The wiring ANL in FIG. 5 is provided in the horizontal direction of the pixel portion 102 without changing the connection relationships between the elements and wirings of FIG. 3.

Figure 6:
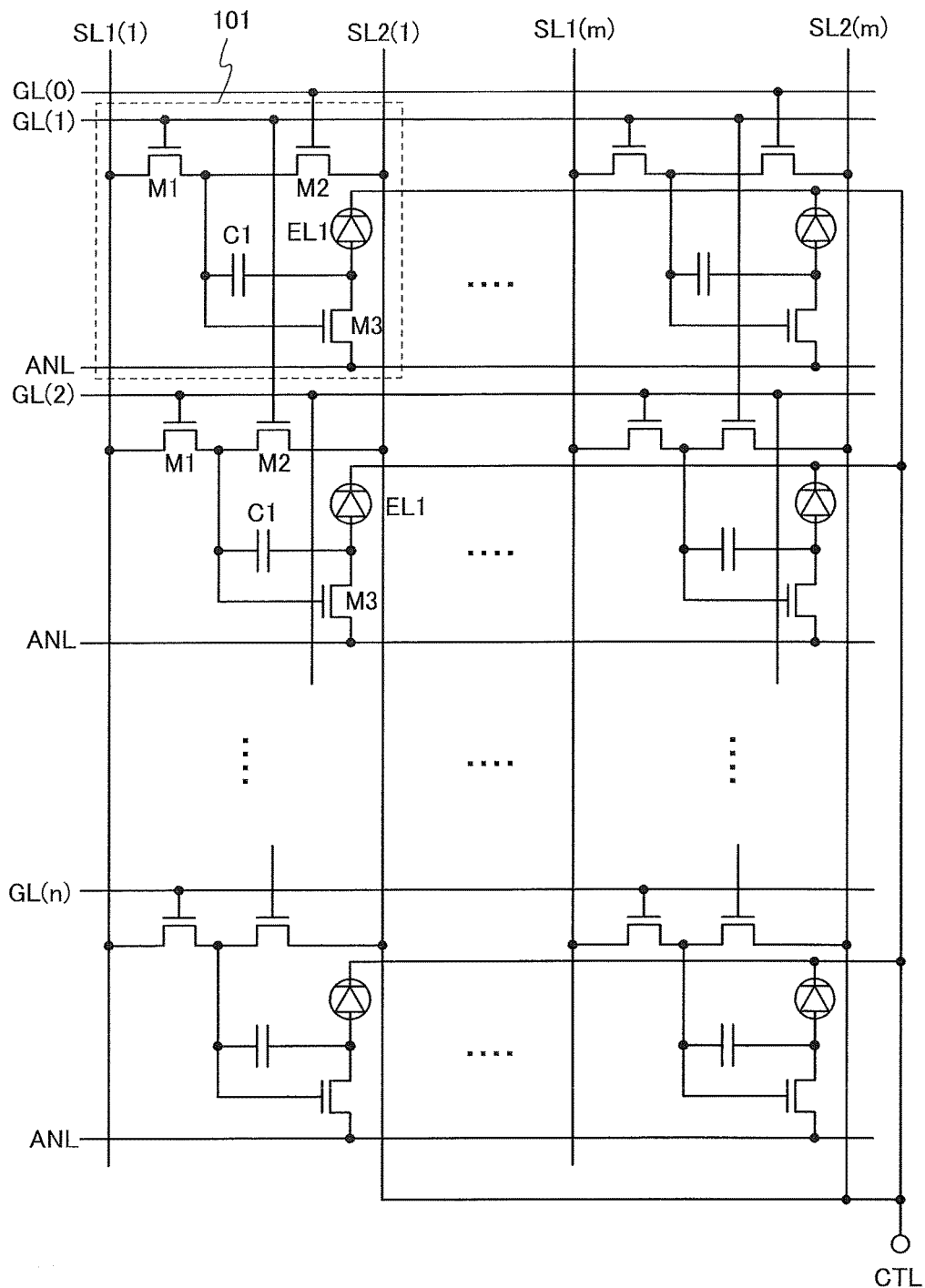
FIG. 6 is a circuit diagram of a pixel portion.

Note that in FIG. 3 and FIG. 5, the wirings SL2 may be connected to the terminal CTL, for example (see FIG. 6).

Figure 7:
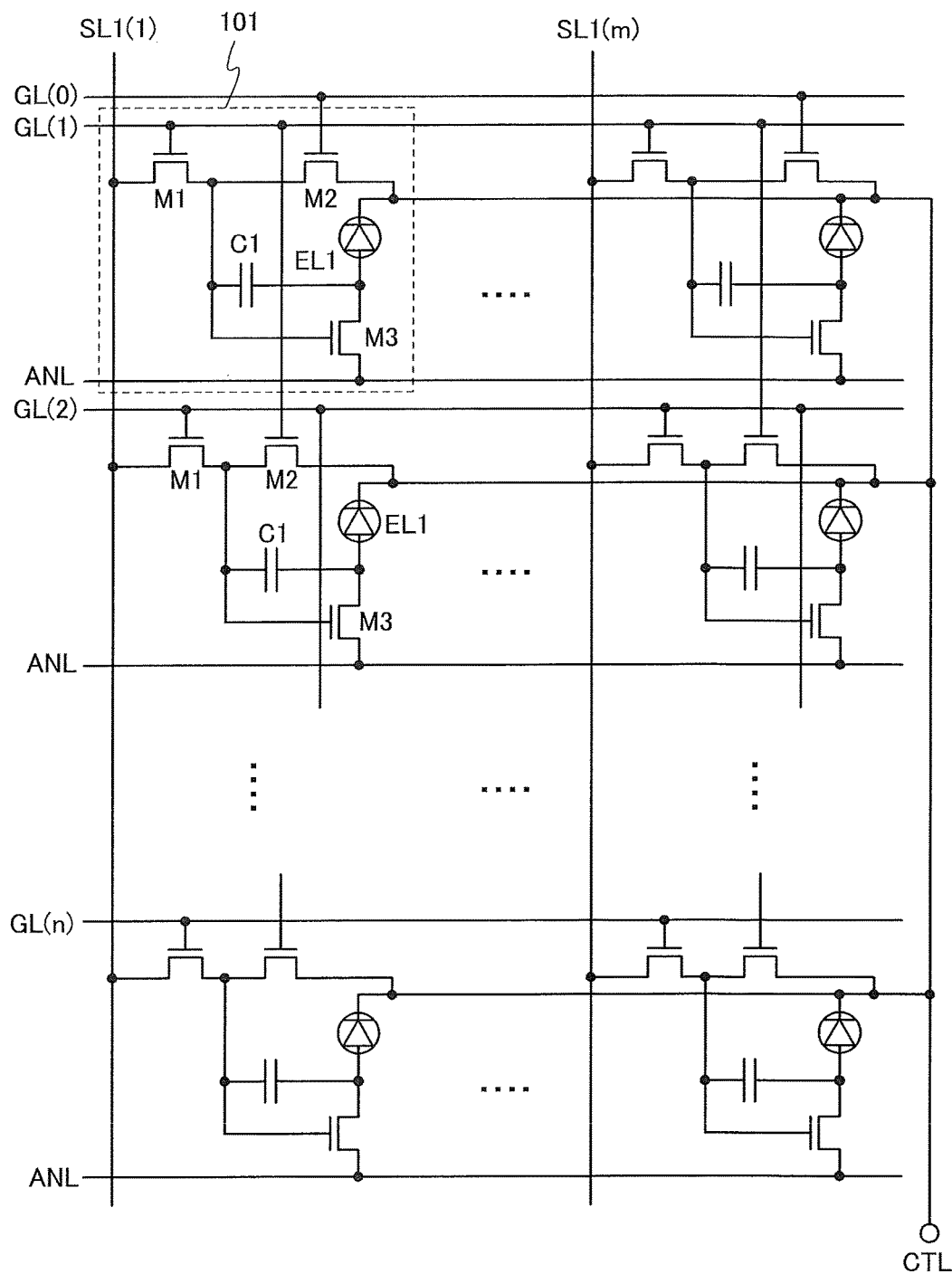
FIG. 7 is a circuit diagram of a pixel portion.

Alternatively, FIG. 3 and FIG. 5 may be modified like FIG. 7, in which the wirings SL2 are not provided, one of a source terminal and a drain terminal of the transistor M2 is connected to the terminal CTL and the other is connected to a gate electrode of the transistor M3.

Figure 8:
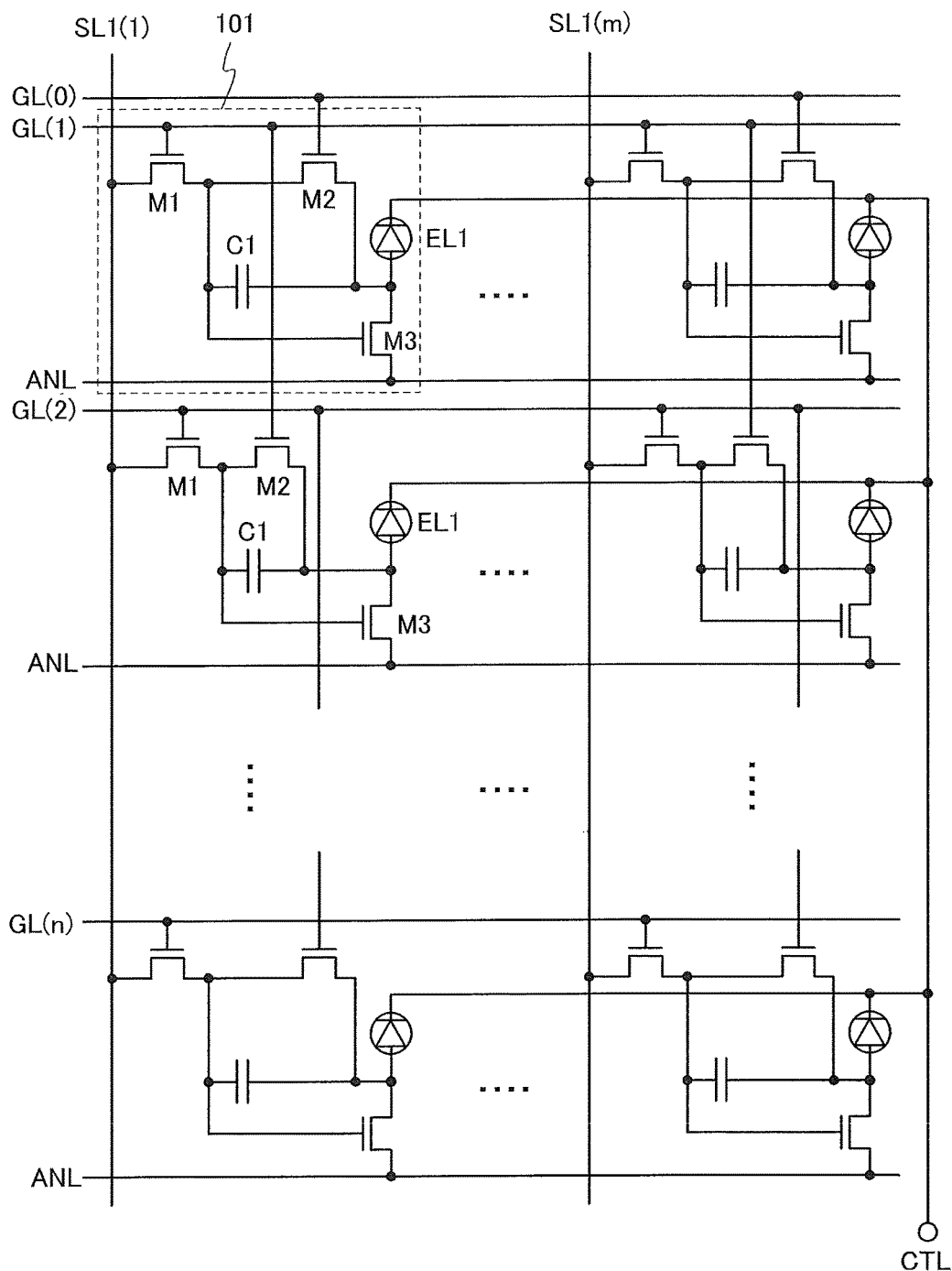
FIG. 8 is a circuit diagram of a pixel portion.

Alternatively, FIG. 3 and FIG. 5 may be modified like FIG. 8, in which the wirings SL2 are not provided, one of the source terminal and the drain terminal of the transistor M2 is connected to the source of the transistor M3 and the other is connected to the gate electrode of the transistor M3. With this modification, when the transistor M2 is turned on, the capacitor C1 is short-circuited to initialize the pixel 101.

Note that this embodiment can be implemented in appropriate combination with other embodiments.

Embodiment 2

In this embodiment, one embodiment of the present invention will be described with reference to FIG. 9. One embodiment of the present invention is effective when the signal Sig1 is input at a high scan frequency, such as in double-frame rate driving. As the scan frequency is increased, the period for inputting the signal Sig1 is shortened, and a potential corresponding to the signal Sig1 is not completely input to a pixel in some cases. However, one embodiment of the present invention can solve the problem.

Figure 9:
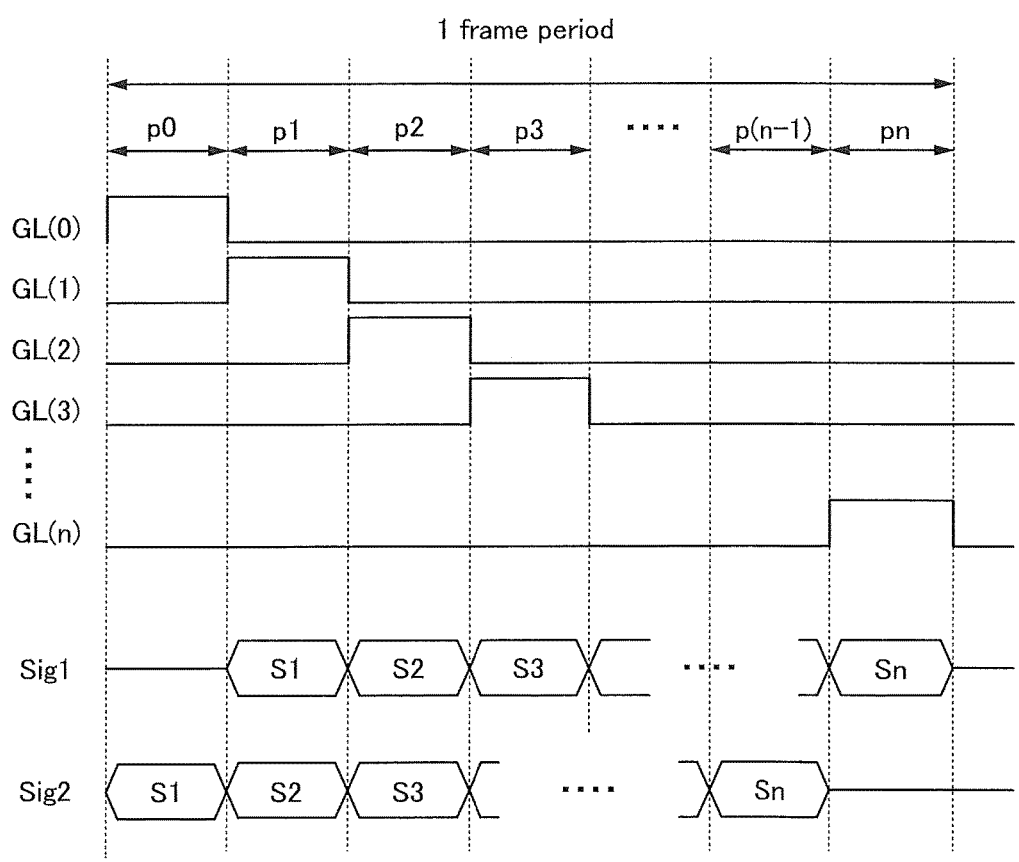
FIG. 9 is a timing chart of a pixel portion.

FIG. 9 is a timing chart of one embodiment the present invention, showing the case where a signal which is the same as the signal Sig1 is input as the signal Sig2 to the wiring SL2 only one GL-selected period earlier than the signal Sig1 is supplied to the wiring SL1. The data of the signal Sig1 and signal Sig2 are referred to as signals S1, S2, S3 to Sn in divided periods.

In the period p0 in FIG. 9, the signal S1 as the signal Sig2 is applied to the wiring SL2 while the wiring GL(0) is selected, and the signal S1 is thus input to the pixels 101 in the first row. In the period p0, the gate electrode of the transistor M3 in the pixel 101 in the first row is precharged using the signal S1.

In the next period p1, while the wiring GL(1) is selected, the signal S1 is input again as the signal Sig1 to the pixel 101 in the first row through the transistor M1. In other words, the signal S1 is input to the pixels 101 in the first row for two periods from the periods p0 to p1. In addition, in the period p1, the gate electrode of the transistor M3 in the pixel 101 in the second row is precharged using the signal Sig2.

Even when the period for inputting the signal Sig1 is reduced in half due to double-frame rate driving, for example, input of the signal Sig2 is performed. As a result, the total period for inputting the signal S1 is not reduced to half, and the signal S1 is input without problems.

When the above operation is performed until the wiring GL(n) is selected, the data from the signals S1 to Sn can be input to the pixel portion 102 without problems even in double-frame rate driving.

Note that this embodiment can be implemented in appropriate combination with other embodiments.

Embodiment 3

In this embodiment, a structure example of the light-emitting device 100 illustrated in FIG. 1A is described in detail.

Figure 10:
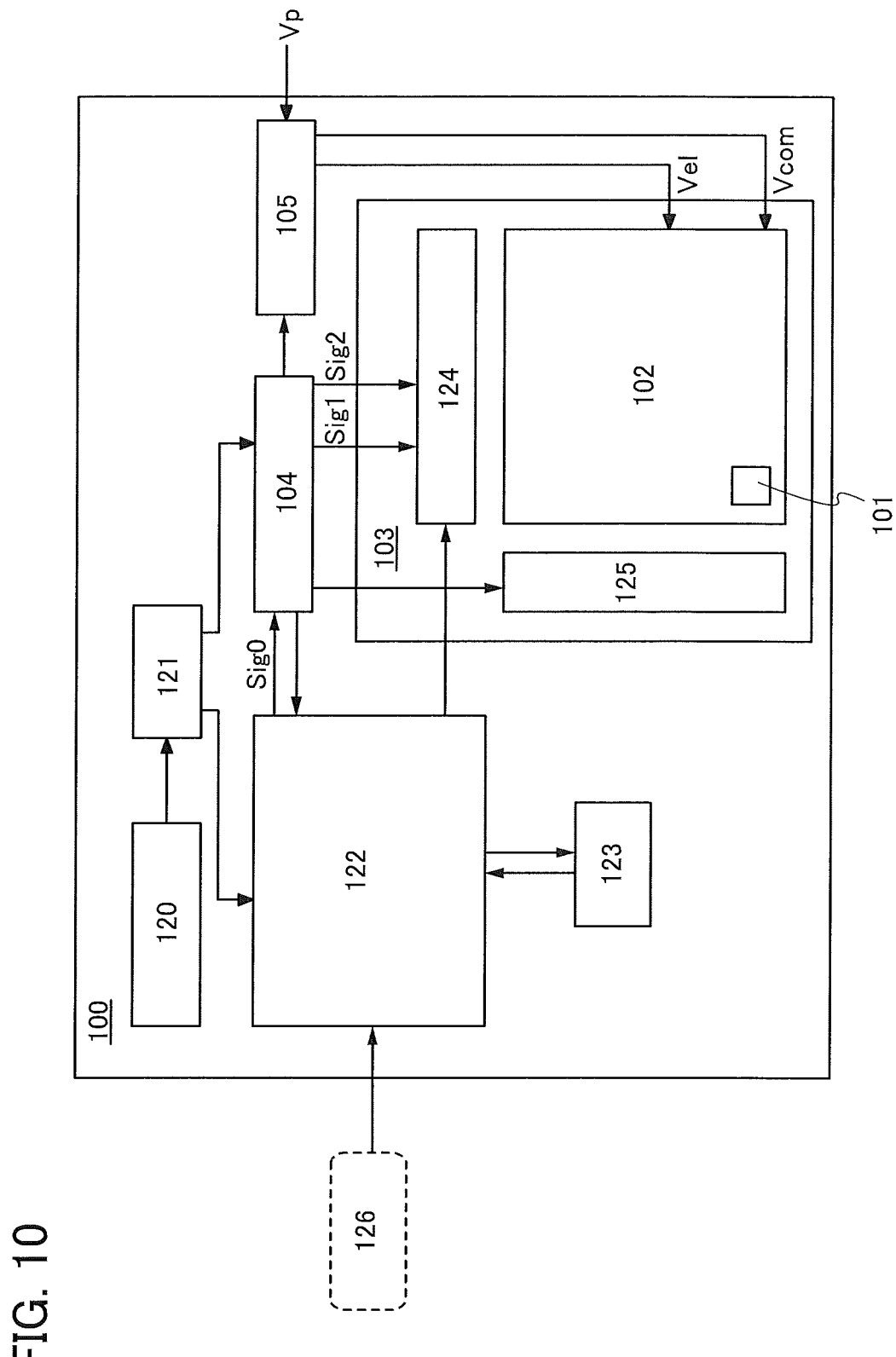
FIG. 10 shows a structure of a light-emitting device.

FIG. 10 is a block diagram illustrating a structure example of a light-emitting device according to one embodiment of the present invention. Like in FIG. 1A, the light-emitting device 100 in FIG. 10 includes the panel 103 including the pixel portion 102 composed of the plurality of pixels 101, the signal line driver circuit (a source driver) 124, and the scan line driver circuit (a gate driver) 125; the controller 104, and the power supply circuit 105. The light-emitting device 100 in FIG. 10 further includes the input device 120, the CPU 121, the image processing circuit 122, and the image memory 123.

The input device 120 has a function of applying data or an instruction to the CPU 121 included in the light-emitting device 100. For example, the input device 120 can apply an instruction to transfer the pixel portion 102 from an operation state to a non-operation state and vice versa, to the CPU 121. As the input device 120, a keyboard, a pointing device, a touch panel, or the like can be used.

The CPU 121 has a function of decoding an instruction input from the input device 120 and executing the instruction by totally controlling operation of various circuits included in the light-emitting device 100.

For example, in the case where the instruction to change the pixel portion 102 from the operation state to the non-operation state is sent from the input device 120, the CPU 121 provides an instruction to the controller 104 to stop the supply of power supply voltage from the power supply circuit 105 to the pixel portion 102.

In the case where the instruction to transfer the pixel portion 102 from the operation state to the non-operation state is sent from the input device 120, the CPU 121 provides an instruction to the controller 104 to restart the supply of power supply voltage from the power supply circuit 105 to the pixel portion 102.

The image memory 123 has a function of storing an image data 126 input to the light-emitting device 100. Note that although just one image memory 123 is provided in the light-emitting device 100 in FIG. 10, a plurality of image memories 123 may be provided in the light-emitting device 100. For example, in the case where the pixel portion 102 displays a full-color image with the use of three pieces of image data 126 corresponding to hues such as red, blue, and green, the image memory 123 corresponding to each of the pieces of image data 126 may be provided.

As the image memories 123, for example, memory circuits such as dynamic random access memories (DRAMs) or static random access memories (SRAMs) can be used. Alternatively, as the image memories 123, video RAMs (VRAMs) may be used.

The image processing circuit 122 has a function of writing and reading the image data 126 to/from the image memory 123 in response to an instruction from the controller 104 and generating the signal Sig1 from the image data 126 which is read from the image memory 123.

Note that the controller 104 has a function of supplying various driving signals used for driving the signal line driver circuit 124, the scan line driver circuit 125, and the like to the panel 103. The driving signal includes a signal line driver circuit start pulse signal SSP, a signal line driver circuit clock signal SCK, and a latch signal LP for controlling operation of the signal line driver circuit 124, a scan line driver circuit start pulse GSP and a scan line driver circuit clock signal GCK for controlling operation of the scan line driver circuit 125, and the like.

Note that this embodiment can be implemented in appropriate combination with other embodiments.

Embodiment 4

In this embodiment, cross-sectional structures and a layout of the light-emitting device and the transistor described in the above embodiments are described using drawings.
<Cross-Sectional Structure of Light-Emitting Device>

Figure 11:
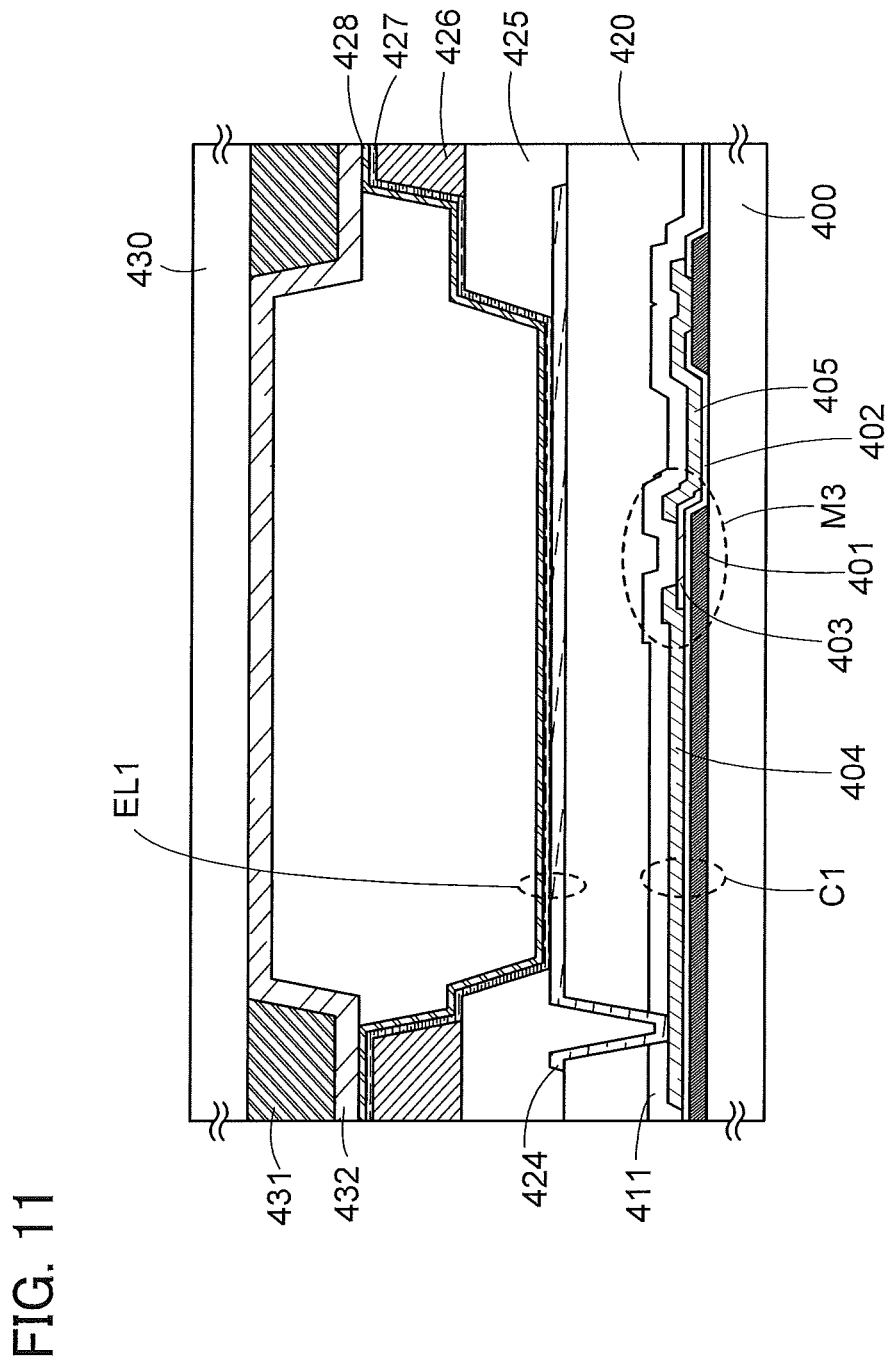
FIG. 11 is a cross-sectional view of a pixel.

FIG. 11 illustrates, as an example, a cross-sectional structure of a pixel portion in a light-emitting device according to one embodiment of the present invention. Note that FIG. 11 illustrates the cross-sectional structures of the transistor M3, the capacitor C1, and the light-emitting element EL1 of the pixel 101 illustrated in FIG. 3.

Specifically, the light-emitting device in FIG. 11 includes the transistor M3 and the capacitor C1 over a substrate 400. The transistor M3 includes a conductive film 401 that functions as a gate; an insulating film 402 over the conductive film 401; a semiconductor film 403 that overlaps the conductive film 401 with the insulating film 402 positioned therebetween; and conductive films 404 and 405 that function as a source and a drain electrically connected to the semiconductor film 403.

The capacitor C1 includes the conductive film 401 that functions as an electrode; the insulating film 402 over the conductive film 401; and the conductive film 404 that overlaps with the conductive film 401 with the insulating film 402 positioned therebetween and functions as an electrode.

The insulating film 402 may be a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in, this specification, oxynitride contains more oxygen than nitrogen, and nitride oxide contains more nitrogen than oxygen.

An insulating film 411 is provided over the semiconductor film 403 and the conductive films 404 and 405. In the case where an oxide semiconductor is used for the semiconductor film 403, it is preferable to use a material that can supply oxygen to the semiconductor film 403 for the insulating film 411. By using the material for the insulating film 411, oxygen contained in the insulating film 411 can be moved to the semiconductor film 403, and the amount of oxygen vacancy in the semiconductor film 403 can be reduced. Oxygen contained in the insulating film 411 can be moved to the semiconductor film 403 efficiently by heat treatment performed after the insulating film 411 is formed.

An insulating film 420 is provided over the insulating film 411, and a conductive film 424 is provided over the insulating film 420. The conductive film 424 is connected to the conductive film 404 through an opening formed in the insulating films 411 and 420.

An insulating film 425 is provided over the insulating film 420 and the conductive film 424. The insulating film 425 has an opening that overlaps with the conductive film 424. Over the insulating film 425, an insulating film 426 is provided in a position that is different from the positions of the openings of the insulating film 425. An EL layer 427 and a conductive film 428 are sequentially stacked over the insulating films 425 and 426. A portion in which the EL layer 427 is in contact with a top surface of the conductive film 42 and a bottom surface of the conductive film 428 positioned therebetween functions as the light-emitting element EL1. One of the conductive films 424 and 428 functions as an anode, and the other functions as a cathode.

The light-emitting device includes a substrate 430 that faces the substrate 400 with the light-emitting element EL1 therebetween. A blocking film 431 that has a function of blocking light is provided over the substrate 430, i.e., over a surface of the substrate 430 that is close to the light-emitting element EL1. The blocking film 431 includes an opening portion in a region overlapping the light-emitting element EL1. In the opening that overlaps with the light-emitting element EL1, a coloring layer 432 that transmits visible light in a specific wavelength range is provided over the substrate 430.

Note that the insulating film 426 for adjusting the distance between the light-emitting element EL1 and the substrate 430 may be omitted in some cases.

Although a top-emission structure in which light emitted from the light-emitting element EL1 is extracted from a side opposite to an element substrate is described in this embodiment, a bottom-emission structure in which light emitted from the light-emitting element EL1 is extracted from the element substrate side or a dual-emission structure in which light emitted from the light-emitting element EL1 is extracted from both the element substrate side and the side opposite to the element substrate can be employed in one embodiment of the present invention.

<Layout of Pixel>

Figure 12:
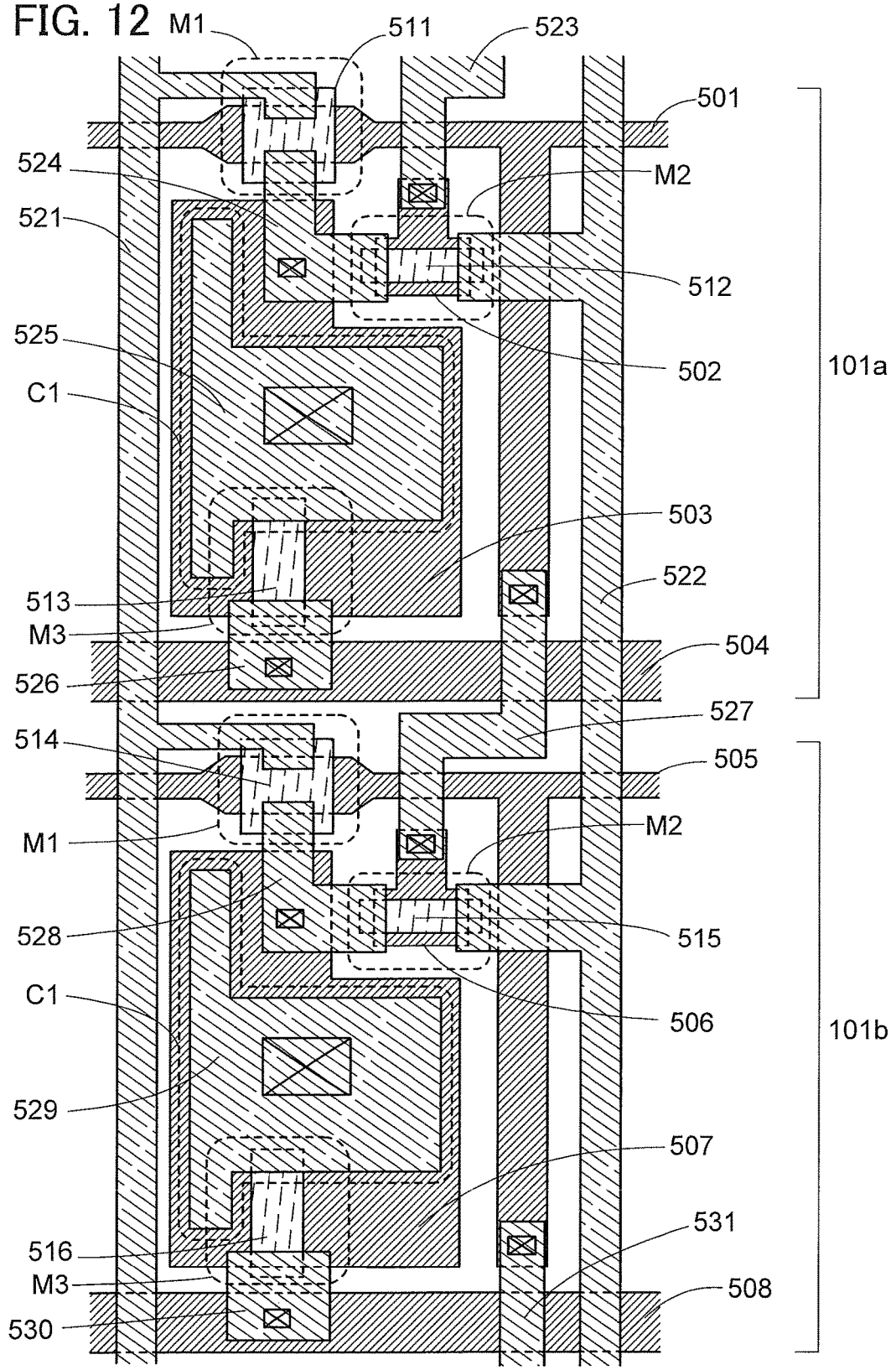
FIG. 12 is a top view of a pixel.

A layout example of the pixels 101 shown in FIG. 5 will be described. FIG. 12 illustrates an example of a top view of the pixels 101 illustrated in FIG. 5. Note that to clarify the layout of the pixel 101, the insulating films and the light-emitting element EL1 (including the conductive film 424, the EL layer 427, and the conductive film 428) are omitted in FIG. 12.

FIG. 12 is a layout of a pixel 101a and a pixel 101b in the next row.

In the pixel 101a, a transistor M1 includes a conductive film 501 serving as a gate, a semiconductor film 511, and a conductive film 521 and a conductive film 524 which are electrically connected to the semiconductor film 511 and serve as a source or a drain. The conductive film 501 functions as the wiring GL.

In the pixel 101a, a transistor M2 includes a conductive film 502 serving as a gate, a semiconductor film 512, and a conductive film 522 and the conductive film 524 which are electrically connected to the semiconductor film 512 and serve as a source or a drain. The conductive film 502 is electrically connected to a wiring GL (not shown) of the previous pixel through the conductive film 523.

In the pixel 101a, a transistor M3 includes a conductive film 503 serving as a gate, a semiconductor film 513, and a conductive film 525 and a conductive film 526 which are electrically connected to the semiconductor film 513 and serve as a source or a drain. The conductive film 526 is electrically connected to a conductive film 504.

In the pixel 101a, the capacitor C1 includes the conductive film 503, the conductive film 525, and an insulating film (not illustrated) provided between the conductive film 503 and the conductive film 525. The conductive film 503 is electrically connected to the conductive film 524.

In the pixel 101a, the conductive film 504 functions as the wiring ANL.

In the pixel 101a, the conductive film 501 is electrically connected to a conductive film 527.

In the pixel 101b, the transistor M1 includes a conductive film 505 serving as a gate, a semiconductor film 514, and the conductive film 521 and a conductive film 528 which are electrically connected to the semiconductor film 514 and serve as a source or a drain. The conductive film 505 functions as the wiring GL.

In the pixel 101b, the transistor M2 includes a conductive film 506 that functions as a gate, a semiconductor film 515, and the conductive film 522 and the conductive film 528 that are electrically connected to the semiconductor film 515 and function as a source and a drain. The conductive film 506 is electrically connected to the conductive film 501 of the pixel 101a through the conductive film 527.

In the pixel 101b, the transistor M3 includes a conductive film 507 serving as a gate, a semiconductor film 516, and a conductive film 529 and a conductive film 530 which are electrically connected to the semiconductor film 516 and serve as a source or a drain. The conductive film 530 is electrically connected to a conductive film 508.

In the pixel 101b, the capacitor C1 includes the conductive film 507, the conductive film 529, and an insulating film (not illustrated) provided between the conductive film 507 and the conductive film 529. The conductive film 507 is electrically connected to the conductive film 528.

In the pixel 101b, the conductive film 508 functions as the wiring ANL.

In the pixel 101b, the conductive film 505 is electrically connected to a gate of the transistor M2 which is included in a pixel in the next row through the conductive film 531.

The conductive films 501 to 508 can be formed in the same process.

The semiconductor films 511 to 516 can be formed in the same process.

The conductive films 521 to 531 can be formed in the same process.

The conductive film 521 functions as the wiring SL1.

The conductive film 522 functions as the wiring SL2.

Although FIG. 12 shows that two adjacent pixels are electrically connected to each other through the conductive films 523, 527, and 531 instead of the conductive films 523, 527, and 531, the pixels may be electrically connected to each other through a conductive film formed in the same step as a step of forming the conductive film 424 shown in FIG. 11.

<Structure of Transistor>

Next, a structure of a transistor 70 that includes a channel formation region in an oxide semiconductor film is described as examples.

Figure 13A:
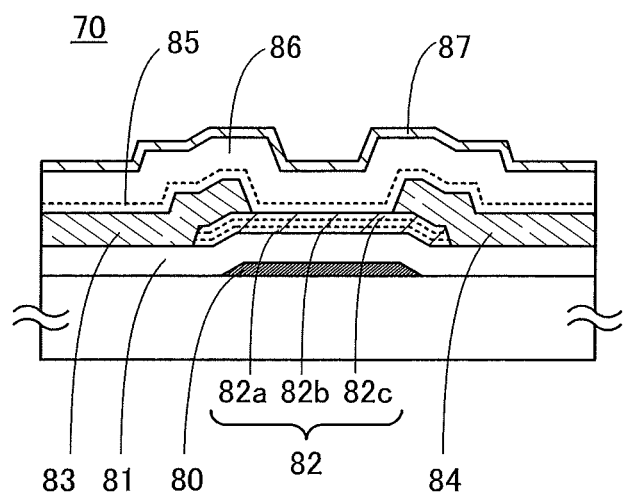
FIGS. 13A and 13B illustrate cross-sectional views of a transistor.

The transistor 70 in FIG. 13A includes a conductive film 80 that functions as a gate; an insulating film 81 over the conductive film 80; an oxide semiconductor film 82 that overlaps with the conductive film 80 with the insulating film 81 positioned therebetween; and conductive films 83 and 84 that function as a source and a drain connected to the oxide semiconductor film 82. The transistor 70 in FIG. 13A further includes insulating films 85 to 87 sequentially stacked over the oxide semiconductor film 82 and the conductive films 83 and 84.

Note that in FIG. 13A, the insulating films 85 to 87 are sequentially stacked over the oxide semiconductor film 82 and the conductive films 83 and 84; however, the number of insulating films provided over the oxide semiconductor film 82 and the conductive films 83 and 84 may be one or two or more.

The insulating film 86 preferably contains oxygen at a proportion higher than or equal to the stoichiometric composition and has a function of supplying part of oxygen to the oxide semiconductor film 82 by heating. In addition, the insulating film 86 preferably has few defects, typically, spin density of ESR spectra (asymmetric ESR spectra at a g value of around 2.001) due to a dangling bond of silicon is preferably lower than or equal to $1\times10^{18}$ spins/cm$^3$ when measured by ESR. Note that in the case where the oxide semiconductor film 82 is damaged at the time of formation of the insulating film 86 when the insulating film 86 is directly formed on the oxide semiconductor film 82, the insulating film 85 is preferably provided between the oxide semiconductor film 82 and the insulating film 86, as illustrated in FIG. 13A. The insulating film 85 preferably causes little damage to the oxide semiconductor film 82 when the insulating film 85 is formed compared with the case of the insulating film 86 and has a function of passing oxygen. If damage to the oxide semiconductor film 82 can be reduced and the insulating film 86 can be formed directly on the oxide semiconductor film 82, the insulating film 85 is not necessarily provided.

The insulating film 85 preferably has a few defects, and typically the spin density at g=2.001 due to a dangling bond of silicon is preferably lower than or equal to $3\times10^{17}$ spins/cm$^3$ when measured by ESR. This is because if the density of defects in the insulating film 85 is high, oxygen is bonded to the defects and the amount of oxygen that permeates the insulating film 85 is decreased.

Furthermore, the interface between the insulating film 85 and the oxide semiconductor film 82 preferably has a few defects, and typically the spin density at g=1.89 to 1.96 due to oxygen vacancies in an oxide semiconductor used for the oxide semiconductor film 82 is preferably lower than or equal to $1\times10^{17}$ spins/cm$^3$, more preferably lower than or equal to the lower detection limit when measured by ESR where a magnetic field is applied parallel to a film surface.

The insulating film 87 preferably has an effect of blocking diffusion of oxygen, hydrogen, and water. Alternatively, the insulating film 87 preferably has an effect of blocking diffusion of hydrogen and water.

As an insulating film has higher density and becomes denser or has a fewer dangling bonds and becomes more chemically stable, the insulating film has a higher blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 87 has an effect of blocking diffusion of water, hydrogen, and the like, impurities such as water and hydrogen that exist in a resin in a panel or exist outside the panel can be prevented from entering the oxide semiconductor film 82. Since an oxide semiconductor is used for the oxide semiconductor film 82, part of water or hydrogen entering the oxide semiconductor serves as an electron donor (donor). Thus, the use of the insulating film 87 having the blocking effect can prevent a shift in threshold voltage of the transistor 70 due to generation of donors.

In addition, since an oxide semiconductor is used for the oxide semiconductor film 82, when the insulating film 87 has an effect of blocking diffusion of oxygen, diffusion of oxygen from the oxide semiconductor to the outside can be prevented. Accordingly, oxygen vacancies in the oxide semiconductor that serve as donors are reduced, so that a shift in threshold voltage of the transistor 70 due to generation of donors can be prevented.

Note that FIG. 13A illustrates an example in which the oxide semiconductor film 82 is formed using a stack of three oxide semiconductor films. Specifically, in the transistor 70 in FIG. 13A, the oxide semiconductor film 82 is formed by stacking oxide semiconductor films 82a to 82c sequentially from the insulating film 81 side. The oxide semiconductor film 82 of the transistor 70 is not limited to a stack of a plurality of oxide semiconductor films, and may be a single oxide semiconductor film.

The oxide semiconductor films 82a and 82c are each an oxide film that contains at least one of metal elements contained in the oxide semiconductor film 82b. The energy at the bottom of the conduction band of the oxide semiconductor films 82a and 82c is closer to a vacuum level than that of the oxide semiconductor film 82b by 0.05 eV or more, 0.07 eV or more, 0.1 eV or more, or 0.15 eV or more and 2 eV or less, 1 eV or less, 0.5 eV or less, or 0.4 eV or less. The oxide semiconductor film 82b preferably contains at least indium in order to increase carrier mobility.

Figure 13B:
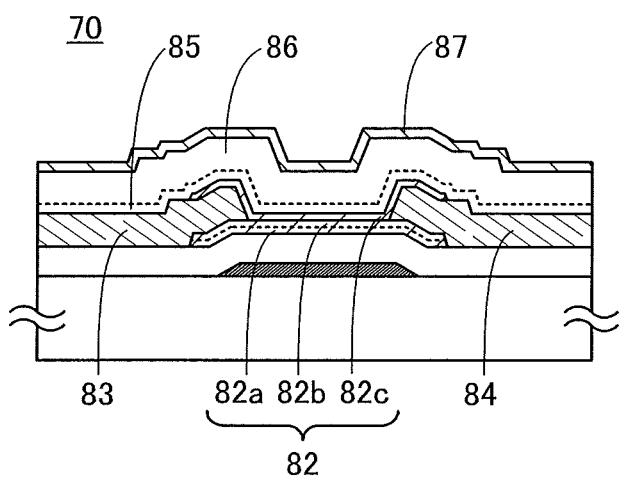

As illustrated in FIG. 13B, over the conductive films 83 and 84, the oxide semiconductor film 82c of the transistor 70 may overlap with the insulating film 85.

There are a few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. Thus, a transistor including a channel formation region in a highly purified oxide semiconductor film has extremely low off-state current and high reliability. Thus, a transistor in which a channel formation region is formed in the oxide semiconductor film is likely to have positive threshold voltage (normally-off characteristics).

Specifically, various experiments can prove low off-state current of a transistor including a channel formation region in a highly purified oxide semiconductor film. For example, the off-state current of even an element having a channel width of $1\times10^6$ μm and a channel length of 10 μm can be less than or equal to the measurement limit of a semiconductor parameter analyzer, that is, less than or equal to $1\times10^{-13}$ A at a voltage between the source electrode and the drain electrode (a drain voltage) of 1 V to 10 V. In this case, it can be seen that off-state current normalized by the channel width of the transistor is less than or equal to 100 zA/μm. In addition, the off-state current is measured using a circuit in which a capacitor and a transistor are connected to each other and charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it is found that, in the case where the voltage between the source electrode and the drain electrode of the transistor is 3 V, a lower off-state current of several tens of yA/μm is obtained. Consequently, the off-state current of the transistor in which a highly purified oxide semiconductor is used for a channel formation region is much lower than that of a transistor including crystalline silicon.

In the case where an oxide semiconductor film is used as a semiconductor film, at least indium (In) or zinc (Zn) is preferably included as an oxide semiconductor. In addition, as a stabilizer for reducing the variation in electrical characteristics of a transistor using the oxide semiconductor, it is preferable that gallium (Ga) be additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a gallium oxide, a tin oxide, a zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Ce—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that, for example, an In—Ga—Zn-based oxide means an oxide containing In, Ga, and Zn, and there is no limitation on the ratio of In:Ga:Zn. In addition, the oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, with the In—Sn—Zn-based oxide, a high mobility can be relatively easily obtained. However, mobility can be increased by reducing the defect density in the bulk also in the case of using the In—Ga—Zn-based oxide.

The oxide semiconductor can be formed by a sputtering method, a chemical vapor deposition (CVD) method (including but not limited to a metal organic chemical vapor deposition (MOCVD) method, an atomic layer deposition (ALD) method, a thermal CVD method, or a plasma enhanced chemical vapor deposition (PECVD) method), a molecular beam epitaxy (MBE) method, or a pulsed laser deposition (PLD) method. In particular, an MOCVD method, an ALD method, or a thermal CVD method is preferably used, in which case the oxide semiconductor layer is hardly damaged since plasma is not used, so that the leakage current in the off state of the transistor can be kept low.

In the case where an In—Ga—Zn-based oxide is formed by a thermal CVD method such as a MOCVD method or an ALD method, trimethylindium, trimethylgallium, and dimethylzinc are used. Note that the chemical formula of trimethylindium is $In(CH_3)_3$. The chemical formula of trimethylgallium is $(CH_3)_3Ga$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

A structure of an oxide semiconductor film is described below.

An oxide semiconductor film is classified roughly into a single crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a CAAC-OS film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface where the CAAC-OS film is formed (hereinafter, a surface where the CAAC-OS film is formed is also referred to as a formation surface) or a top surface of the CAAC-OS film, and is arranged to be parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

On the other hand, according to a TEM image of the CAAC-OS film observed in a direction substantially perpendicular to the sample surface (plan UM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a nominal vector of a top surface of the CAAC-OS film Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

With use of the CAAC-OS film in a transistor, a variation in the electrical characteristics of the transistor due to irradiation with visible light or ultraviolet light is small Thus, the transistor has high reliability.

A transistor including the CAAC-OS film has higher resistance to external force, such as deformation by bending the substrate, than a Poly-Si transistor or a single crystal Si transistor, and is thus suitable for a flexible substrate such as a plastic substrate.

Note that an oxide semiconductor film may be a stacked film including two or more kinds of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the sputtered particle is attached to the substrate.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

As an example of the target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, 1:4:4, or 3:1:2. The kinds of powders and the molar ratio for mixing powders may be determined as appropriate depending on the desired target.

An alkali metal is not an element included in an oxide semiconductor and thus is an impurity. Likewise, an alkaline earth metal is an impurity when the alkaline earth metal is not a component of the oxide semiconductor. When an insulating film in contact with an oxide semiconductor film is an oxide, Na, among the alkali metals, diffuses into the insulating film and becomes $Na^+$. Further, in the oxide semiconductor film, Na cuts or enters a bond between metal and oxygen which are components of the oxide semiconductor. As a result, the electrical characteristics of the transistor deteriorate; for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably $5\times10^{16}/cm^3$ or lower, further preferably $1\times10^{16}/cm^3$ or lower, still further preferably $1\times10^{15}/cm^3$ or lower. Similarly, the measurement value of a Li concentration is preferably $5\times10^{15}/cm^3$ or lower, further preferably $1\times10^{15}/cm^3$ or lower. Similarly, the measurement value of a K concentration is preferably $5\times10^{15}/cm^3$ or lower, further preferably $1\times10^{15}/cm^3$ or lower.

When metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electrical characteristics of the transistor are likely to deteriorate as in the case of using an alkali metal or an alkaline earth metal. Thus, the concentrations of silicon and carbon in the oxide semiconductor film are preferably low. Specifically, the carbon concentration or the silicon concentration measured by secondary ion mass spectrometry is $1\times10^{18}/cm^3$ or lower. In this case, the deterioration of the electrical characteristics of the transistor can be prevented, so that the reliability of a semiconductor device can be improved.

A metal in the source electrode and the drain electrode might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy.

The n-type region serves as a source region or a drain region, resulting in a decrease in the contact resistance between the oxide semiconductor film and the source electrode or the drain electrode. Accordingly, the formation of the n-type region increases the mobility and on-state current of the transistor, which achieves high-speed operation of a semiconductor device using the transistor.

Note that the extraction of oxygen by a metal in the source electrode and the drain electrode is probably caused when the source electrode and the drain electrode are formed by a sputtering method or the like or when heat treatment is performed after the formation of the source electrode and the drain electrode.

The n-type region is more likely to be formed when the source and drain electrodes are formed using a conductive material that is easily bonded to oxygen. Examples of such a conductive material include Al, Cr, Cu, Ta, Ti, Mo, and W.

The oxide semiconductor film is not limited to a single metal oxide film and may have a stacked structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose energy at the bottom of the conduction band is closer to the vacuum level than that of the second metal oxide film by 0.05 eV or more, 0.07 eV or more, 0.1 eV or more, or 0.15 eV or more and 2 eV or less, 1 eV or less, 0.5 eV or less, or 0.4 eV or less. Further, the second metal oxide film preferably contains at least indium in order to increase the carrier mobility.

In the transistor including the above semiconductor film, when a voltage is applied to the gate electrode so that an electric field is applied to the semiconductor film, a channel formation region is formed in the second metal oxide film, whose energy at the bottom of the conduction band is the lowest. That is, since the third metal oxide film is provided between the second metal oxide film and the gate insulating film, a channel formation region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

If an interface level is formed at the interface between the second metal oxide film and the first metal oxide film, a channel formation region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of the transistor, such as the threshold voltage.

Further, it is preferable that a plurality of metal oxide films be stacked so that an interface level due to impurities existing between the metal oxide films, which inhibits carrier flow, is not formed at the interface between the metal oxide films. This is because if impurities exist between the stacked metal oxide films, the continuity of the energy at the bottom of the conduction band between the metal oxide films is lost, and carriers are trapped or disappear by recombination in the vicinity of the interface. By reducing impurities existing between the films, a continuous junction (here, particularly a U-shape well structure with the energy at the bottom of the conduction band changed continuously between the films) is formed more easily than the case of merely stacking a plurality of metal oxide films that contain at least one common metal as a main component.

In order to form continuous junction, the films need to be stacked successively without being exposed to the air by using a multi-chamber deposition system (sputtering apparatus) provided with a load lock chamber. Each chamber of the sputtering apparatus is preferably evacuated to a high vacuum (to the degree of about $5 \times 10^{-7}$ Pa to $1 \times 10^{-4}$ Pa) by an adsorption vacuum pump such as a cryopump so that water and the like acting as impurities for the oxide semiconductor film are removed as much as possible. Alternatively, a combination of a turbo molecular pump and a cold trap is preferably used to prevent back-flow of a gas from an exhaust system into a chamber.

Not only high vacuum evacuation in a chamber but also high purity of a sputtering gas is necessary to obtain a high-purity intrinsic oxide semiconductor. As an oxygen gas or an argon gas used as the sputtering gas, a gas that is highly purified to have a dew point of $-40°$ C. or lower, preferably $-80°$ C. or lower, more preferably $-100°$ C. or lower is used, so that entry of moisture or the like into the oxide semiconductor film can be prevented as much as possible. Specifically, when the second metal oxide film contains an In-M-Zn oxide (M represents Ga, Y, Zr, La, Ce, or Nd) and a target having the atomic ratio of metal elements of In:M:Zn=$x_1$:$y_1$:$z_1$ is used for forming the second metal oxide film, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film is easily formed as the second metal oxide film. Typical examples of the atomic ratio of the metal elements of the target are In:M:Zn=1:1:1, In:M:Zn=3:1:2, and the like.

Specifically, when the first metal oxide film and the third metal oxide film contain an In-M-Zn oxide (M represents Ga, Y, Zr, La, Ce, or Nd) and a target having the atomic ratio of metal elements of In:M:Zn=$x_2$:$y_2$:$z_2$ is used for forming the first metal oxide film and the third metal oxide film, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the first metal oxide film and the third metal oxide film. Typical examples of the atomic ratio of the metal elements of the target are In:MZn=1:3:2, In:MZn=1:3:4, In:M:Zn=1:3:6, In:M:Zn=1:3:8, and the like.

The thickness of the first metal oxide film and the third metal oxide film is greater than or equal to 3 nm and less than or equal to 100 nm, preferably greater than or equal to 3 nm and less than or equal to 50 nm. The thickness of the second metal oxide film is greater than or equal to 3 nm and less than or equal to 200 nm, preferably greater than or equal to 3 nm and less than or equal to 100 nm, further preferably greater than or equal to 3 nm and less than or equal to 50 nm.

In the three-layer semiconductor film, the first to third metal oxide films can be amorphous or crystalline. Note that the transistor can have stable electrical characteristics when the second metal oxide film where a channel formation region is formed is crystalline; therefore, the second metal oxide film is preferably crystalline.

Note that a channel formation region refers to a region of a semiconductor film of a transistor that overlaps with a gate electrode and is located between a source electrode and a drain electrode. Further, a channel region refers to a region through which current mainly flows in the channel formation region.

For example, when an In—Ga—Zn-based oxide film formed by a sputtering method is used as the first and third metal oxide films, a target that is an In—Ga—Zn-based oxide containing In, Ga, and Zn at an atomic ratio of 1:3:2 can be used to deposit the first and third metal oxide films. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the second metal oxide film is a CAAC-OS film, a target including polycrystalline In—Ga—Zn-based oxide containing In, Ga, and Zn at an atomic ratio of 1:1:1 is preferably used to deposit the second metal oxide film. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the end portions of the semiconductor film in the transistor may be tapered or rounded.

Also in the case where a semiconductor film including stacked metal oxide films is used in the transistor, a region in contact with the source electrode or the drain electrode may be an n-type region. Such a structure increases the mobility and on-state current of the transistor and achieves high-speed operation of a semiconductor device using the transistor. Further, when the semiconductor film including the stacked metal oxide films is used in the transistor, the n-type region particularly preferably reaches the second metal oxide film part of which is to be a channel formation region, because the mobility and on-state current of the transistor are further increased and higher-speed operation of the semiconductor device is achieved.

This embodiment can be implemented in appropriate combination with any of the other embodiments.

Embodiment 5

Figure 14:
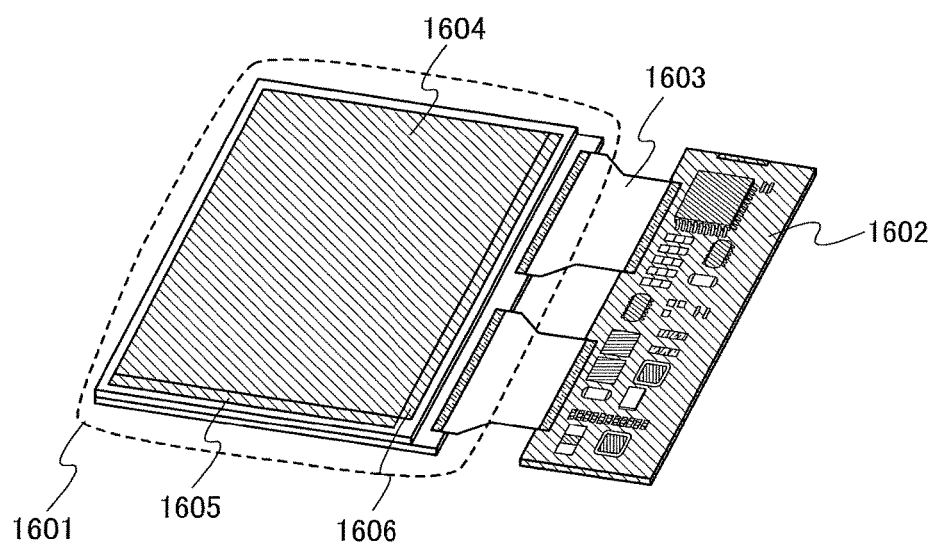
FIG. 14 is a perspective view of a light-emitting device.

FIG. 14 is an example of a perspective view of the light-emitting device according to one embodiment of the present invention.

The light-emitting device illustrated in FIG. 14 includes a panel 1601; a circuit board 1602 including a controller, a power circuit, an image processing circuit, an image memory, a CPU, and the like; and a connection portion 1603. The panel 1601 includes a pixel portion 1604 including a plurality of pixels, a scan line driver circuit 1605 that selects pixels per row, and a signal line driver circuit 1606 that controls input of the signal Sig1 or the signal Sig2 to the pixels in a selected row.

A variety of signals and power supply potentials are input from the circuit board 1602 to the panel 1601 through the connecting portions 1603. As the connecting portion 1603, a flexible printed circuit (FPC) or the like can be used. In the case where a COF tape is used as the connecting portion 1603, part of circuits in the circuit board 1602 or part of the scan line driver circuit 1605 or the signal line driver circuit 1606 included in the panel 1601 may be formed on a chip separately prepared, and the chip may be connected to the COF tape by chip on film (COF).

This embodiment can be implemented in appropriate combination with any of the other embodiments.

Embodiment 6

The light-emitting device according to one embodiment of the present invention can be used for display devices, notebook personal computers, or image reproducing devices provided with recording media (typically, devices which reproduce the content of recording media such as digital versatile discs (DVDs) and have displays for displaying the reproduced images). Other than the above, as an electronic device which can use the light-emitting device according to one embodiment of the present invention, cellular phones, portable game machines, portable information terminals, electronic books, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 15A to 15F.

FIG. 15A illustrates a display device including a housing 5001, a display portion 5002, a supporting base 5003, and the like. The light-emitting device according to one embodiment of the present invention can be used for the display portion 5002. Note that the display device includes all devices for displaying information such as for a personal computer, for receiving TV broadcasting, and for displaying an advertisement.

FIG. 15B illustrates a portable information terminal including a housing 5101, a display portion 5102, operation keys 5103, and the like. The light-emitting device according to one embodiment of the present invention can be used for the display portion 5102.

FIG. 15C illustrates a display device including a housing 5701 having a curved surface, a display portion 5702, and the like. When a flexible substrate is used for the light-emitting device according to one embodiment of the present invention, it is possible to use the light-emitting device as the display portion 5702 supported by the housing 5701 having a curved surface. Consequently, it is possible to provide a user-friendly display device that is flexible and lightweight.

FIG. 15D illustrates a portable game machine including a housing 5301, a housing 5302, a display portion 5303, a display portion 5304, a microphone 5305, a speaker 5306, an operation key 5307, a stylus 5308, and the like. The light-emitting device according to one embodiment of the present invention can be used for the display portion 5303 or the display portion 5304. When the light-emitting device according to one embodiment of the present invention is used as the display portion 5303 or 5304, it is possible to provide a user-friendly portable game machine with quality that hardly deteriorates. Note that although the portable game machine illustrated in FIG. 23D includes the two display portions 5303 and 5304, the number of display portions included in the portable game machine is not limited to two.

FIG. 15E illustrates an e-book reader, which includes a housing 5601, a display portion 5602, and the like. The light-emitting device according to one embodiment of the present invention can be used for the display portion 5602. When a flexible substrate is used, the light-emitting device can have flexibility, so that it is possible to provide a flexible and lightweight e-book reader.

FIG. 15F illustrates a cellular phone, which includes a display portion 5902, a microphone 5907, a speaker 5904, a camera 5903, an external connection portion 5906, and an operation button 5905 in a housing 5901. It is possible to use the light-emitting device according to one embodiment of the present invention as the display portion 5902. When the light-emitting device according to one embodiment of the present invention is provided over a flexible substrate, the light-emitting device can be used as the display portion 5902 having a curved surface, as illustrated in FIG. 15F.

This embodiment can be implemented in appropriate combination with any of the other embodiments.

Embodiment 7

In this embodiment, a transistor which can be used as the transistors M1 to M3 in Embodiment 1 and Embodiment 2 is described with reference to FIGS. 16A to 16C.

Figure 16A:
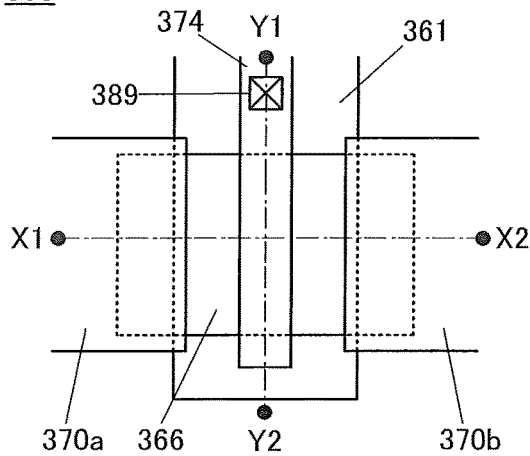
FIGS. 16B and 16C are cross-sectional views of a transistor and FIG. 16A is a top view of the transistor.
Figure 16B:
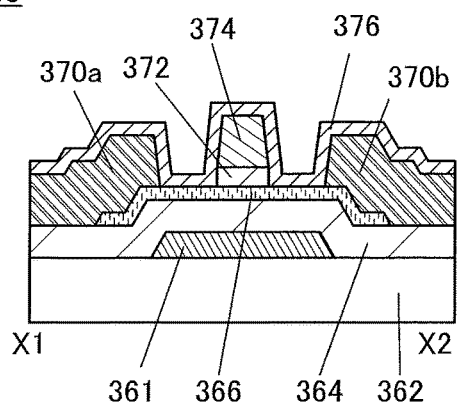
Figure 16C:
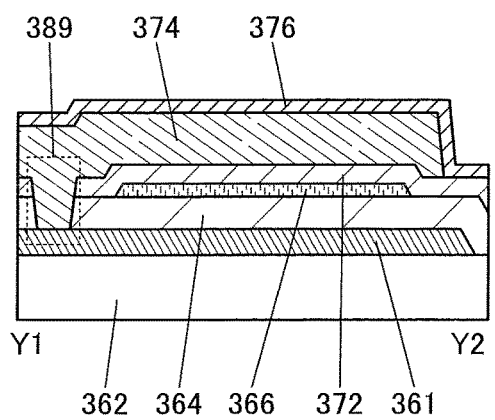

FIG. 16A is a top view of the transistor 300, FIG. 16B is a cross-sectional view taken along dashed-dotted line X1-X2 of FIG. 16A, and FIG. 16C is a cross-sectional view taken along dashed-dotted line Y1-Y2 of FIG. 16A. FIG. 16B is a cross-sectional view in the channel length direction of the transistor 300 and FIG. 16C is a cross-sectional view in the channel width direction of the transistor 300. Note that in FIG. 16A, some components are not illustrated for clarity.

The transistor 300 includes a conductive film 361 over a substrate 362, an insulating film 364 over the substrate 362 and the conductive film 361, an oxide semiconductor film 366 over the insulating film 364, a conductive film 370a, a conductive film 370b, and an insulating film 372 which are in contact with the oxide semiconductor film 366, and a conductive film 374 overlapping with the oxide semiconductor film 366 with the insulating film 372 provided therebetween. Note that an insulating film 376 is provided over the transistor 300.

In the transistor 300, the conductive films 374 and 361 function as a first gate electrode and a second gate electrode, respectively. The insulating films 372 and 364 function as a first gate insulating film and a second gate insulating film, respectively.

In the transistor 300, the conductive film 370a has a function as one of a source electrode and a drain electrode, and the conductive film 370b has a function as the other of the source electrode and the drain electrode.

As shown in FIG. 16C, the conductive film 374 is connected to the conductive film 361 through an opening 389 in the insulating films 372 and 364. The same potential is applied to the first gate electrode and the second gate electrode of the transistor 300; thus, the increase in on-state current can be suppressed, variations in the initial characteristics can be reduced, and degradation of the transistor due to the −GBT (minus Gate Bias Temperature) stress test and a change in the rising voltage of the on-state current at different drain voltages can be suppressed.

In the transistor 300, different potentials may be applied to the conductive films 374 and 361 which are not connected to each other. With this structure, the threshold voltage of the transistor 300 can be controlled. Note that the conductive film 361 may be omitted.

Regions of the oxide semiconductor film 366 not overlapping with the conductive films 370a, 370b, and 374 contain an element forming an oxygen vacancy. The element forming an oxygen vacancy will be described as an impurity element. Typical examples of impurity elements are hydrogen, rare gas elements, and the like. Typical examples of rare gas elements are helium, neon, argon, krypton, and xenon. In addition, boron, carbon, nitrogen, fluorine, aluminum, silicon, phosphorus, chlorine, and the like may be contained in the oxide semiconductor film 366.

The insulating film 376 contains hydrogen and is typically a nitride insulating film. Since the insulating film 376 is in contact with the oxide semiconductor film 366, the hydrogen contained in the insulating film 376 is diffused into the oxide semiconductor film 366. As a result, regions of the oxide semiconductor film 366 in contact with the insulating film 376 contain much hydrogen.

When the rare gas element is added as an impurity element to the oxide semiconductor film, a bond between a metal element and oxygen in the oxide semiconductor film is cut, whereby an oxygen vacancy is formed. Interaction between an oxygen vacancy in the oxide semiconductor film and hydrogen can increase the conductivity of the oxide semiconductor film. Specifically, hydrogen enters into the oxygen vacancies in the oxide semiconductor film, whereby an electron serving as a carrier is produced. As a result, the conductivity is increased.

Examples of the substrate 362 include a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base film. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic. A film made of polypropylene, polyester, polyvinyl fluoride, polyvinyl chloride, or the like, an inorganic film formed by evaporation, or the like can also be used as a bonding film. Examples of a base film are base films formed using polyester, polyamide, polyimide, aramid, epoxy, an inorganic vapor a deposition film, and paper.

The substrate 362 is not limited to a simple support, and may be a substrate where an element such as a transistor or a capacitor is formed.

As a material used for the conductive films 361 and 374, a metal element selected from aluminum, chromium, copper, tantalum, titanium, molybdenum, and tungsten, an alloy containing any of these metal elements as a component, an alloy containing these metal elements in combination, or the like can be used. The conductive films 361 and 374 may have a single-layer structure or a stacked-layer structure of two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used. The conductive films 361 and 374 can be formed by a sputtering method, for example.

An indium-containing oxide may be used for the conductive films 361 and 374. The conductive films can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The conductive films 370a and 370b can be formed using the conductive film having a single-layer structure or a stacked-layer structure with any of metals such as aluminum, titanium, chromium, nickel, copper, yttrium, zirconium, molybdenum, silver, tantalum, and tungsten, or an alloy containing any of these metals as its main component. In particular, one or more elements selected from aluminum, chromium, copper, tantalum, titanium, molybdenum, and tungsten are preferably included. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. The conductive film can be formed by a sputtering method, for example.

The oxide semiconductor film 82 in FIG. 13 can be referred to for the details of the oxide semiconductor film 366.

The insulating film 364 can be formed using a single layer or a multilayer of an oxide insulating film or a nitride insulating film. Note that an oxide insulating film is preferably used for at least a region of the insulating film 364, which is in contact with the oxide semiconductor film 366, in order to improve characteristics of the interface with the oxide semiconductor film 366. Since the oxide insulating film from which oxygen is released by heating is used as the insulating film 364, oxygen contained in the insulating film 364 can be transferred to the oxide semiconductor film 366 by heat treatment.

The thickness of the base insulating film 364 is greater than or equal to 50 nm, greater than or equal to 100 nm and less than or equal to 3000 nm, or greater than or equal to 200 nm and less than or equal to 1000 nm. With use of the thick insulating film 364, the amount of oxygen released from the insulating film 364 can be increased, and the interface state density at the interface between the insulating film 364 and the oxide semiconductor film 366 and oxygen vacancy included in a channel formation region of the oxide semiconductor film 366 can be reduced.

The insulating film 364 can be formed to have a single-layer structure or a stacked-layer structure using, for example, a silicon oxide film, a silicon oxynitride film, a silicon nitride oxide film, a silicon nitride film, an aluminum oxide film, a hafnium oxide film, and a gallium oxide film.

The insulating film 372 can be formed to have a single-layer structure of a stacked-layer structure using an oxide insulating film or a nitride insulating film Note that in order to improve the characteristics of the interface between the insulating film 372 and the oxide semiconductor film 366, a region of the insulating film 372 which is in contact with at least the oxide semiconductor film 366 preferably includes an oxide insulating film. The insulating film 372 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, and a gallium oxide film.

It is possible to prevent outward diffusion of oxygen from the oxide semiconductor film 366 and entry of hydrogen, water, or the like into the oxide semiconductor film 366 from the outside by providing an insulating film having a blocking effect against oxygen, hydrogen, water, and the like as the insulating film 372. As the insulating film which has an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used.

The insulating film 372 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage of the transistor can be reduced.

An oxide insulating film that releases oxygen by being heated is preferably used as the insulating film 372, in which case oxygen contained in the insulating film 372 can be moved to the oxide semiconductor film 366 by heat treatment.

The thickness of the insulating film 372 is 5 nm to 400 nm inclusive, 5 nm to 300 nm inclusive, or 10 nm to 250 nm inclusive.

This embodiment can be implemented in appropriate combination with any of the other embodiments.

This application is based on Japanese Patent Application serial no. 2013-255172 filed with Japan Patent Office on Dec. 10, 2013, the entire contents of which are hereby incorporated by reference.

What is claimed is:

1. A light-emitting device comprising:
   a first pixel comprising:
      a first transistor;
      a second transistor;
      a third transistor, a gate of the third transistor directly connected to one of a source and a drain of the first transistor and one of a source and a drain of the second transistor; and
      a first light-emitting element, a first terminal of the first light-emitting element directly connected to one of a source and a drain of the third transistor;
   a second pixel comprising:
      a fourth transistor;
      a fifth transistor;
      a sixth transistor, a gate of the sixth transistor directly connected to one of a source and a drain of the fourth transistor and one of a source and a drain of the fifth transistor; and
         a second light-emitting element, a first terminal of the second light-emitting element directly connected to one of a source and a drain of the sixth transistor;
   a first wiring electrically connected to a gate of the second transistor;
   a second wiring directly connected to a gate of the first transistor and a gate of the fifth transistor;
   a third wiring electrically connected to a gate of the fourth transistor;
   a fourth wiring electrically connected to the other of the source and the drain of the first transistor and the other of the source and the drain of the fourth transistor; and
   a fifth wiring electrically connected to the other of the source and the drain of the second transistor and the other of the source and the drain of the fifth transistor.

2. The light-emitting device according to claim 1,
   wherein the other of the source and the drain of the third transistor is supplied with a first potential,
   wherein a second terminal of the first light-emitting element is supplied with a second potential,
   wherein the other of the source and the drain of the sixth transistor is supplied with the first potential,
   wherein a second terminal of the second light-emitting element is supplied with the second potential,
   wherein the fourth wiring is supplied with a signal containing image data, and
   wherein the fifth wiring is supplied with a third potential.

3. The light-emitting device according to claim 2, wherein the third potential has the same value as the first potential or the second potential.

4. The light-emitting device according to claim 1, wherein each of the first to the sixth transistors contains an oxide semiconductor in a channel formation region.

5. The light-emitting device according to claim 4,
   wherein the oxide semiconductor contains indium, zinc, and M, and
   wherein M is gallium, tin, hafnium, aluminum, or zirconium.

6. An electronic device comprising the light-emitting device according to claim 1, a microphone, and an operation key.

7. A light-emitting device comprising:
   a first pixel comprising:
      a first transistor;
      a second transistor;
      a third transistor, a gate of the third transistor directly connected to one of a source and a drain of the first transistor and one of a source and a drain of the second transistor; and
      a first light-emitting element, a first terminal of the first light-emitting element directly connected to one of a source and a drain of the third transistor;
   a second pixel comprising:
      a fourth transistor;
      a fifth transistor;
      a sixth transistor, a gate of the sixth transistor directly connected to one of a source and a drain of the fourth transistor and one of a source and a drain of the fifth transistor; and
         a second light-emitting element, a first terminal of the second light-emitting element directly connected to one of a source and a drain of the sixth transistor;
   a first wiring electrically connected to a gate of the second transistor;
   a second wiring directly connected to a gate of the first transistor and a gate of the fifth transistor;
   a third wiring electrically connected to a gate of the fourth transistor;

a fourth wiring electrically connected to the other of the source and the drain of the first transistor and the other of the source and the drain of the fourth transistor; and a fifth wiring electrically connected to the other of the source and the drain of the second transistor and the other of the source and the drain of the fifth transistor, wherein the fourth wiring is supplied with a signal containing image data, and wherein the fifth wiring is supplied with the signal before supplying the signal to the fourth wiring.

8. The light-emitting device according to claim 7, wherein the other of the source and the drain of the third transistor is supplied with a first potential, wherein a second terminal of the first light-emitting element is supplied with a second potential, wherein the other of the source and the drain of the sixth transistor is supplied with the first potential, and wherein a second terminal of the second light-emitting element is supplied with the second potential.

9. The light-emitting device according to claim 7, wherein each of the first to the sixth transistors contains an oxide semiconductor in a channel formation region.

10. The light-emitting device according to claim 9, wherein the oxide semiconductor contains indium, zinc, and M, and wherein M is gallium, tin, hafnium, aluminum, or zirconium.

11. An electronic device comprising the light-emitting device according to claim 7, a microphone, and an operation key.

* * * * *